United States Patent
Inoue et al.

(10) Patent No.: US 6,770,936 B2
(45) Date of Patent: *Aug. 3, 2004

(54) THIN FILM TRANSISTORS, AND LIQUID CRYSTAL DISPLAY DEVICE AND ELECTRONIC APPARATUS USING THE SAME

(75) Inventors: Satoshi Inoue, Suwa (JP); Ichio Yudasaka, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/077,207
(22) PCT Filed: Oct. 8, 1997
(86) PCT No.: PCT/JP97/03626

§ 371 (c)(1),
(2), (4) Date: May 26, 1998

(87) PCT Pub. No.: WO98/15973
PCT Pub. Date: Apr. 16, 1998

(65) Prior Publication Data

US 2001/0038097 A1 Nov. 8, 2001

(30) Foreign Application Priority Data

Oct. 9, 1996 (JP) .............................................. 8-268288

(51) Int. Cl.⁷ .............................................. H01L 27/01
(52) U.S. Cl. .......................... 257/347; 257/401; 257/72; 257/369; 257/773; 257/775
(58) Field of Search ................................. 257/347, 401, 257/59, 72, 369, 773, 775, 350, 351

(56) References Cited

U.S. PATENT DOCUMENTS

| | | | | |
|---|---|---|---|---|
| 4,996,574 A | * | 2/1991 | Shirasaki | 257/347 |
| 5,095,348 A | * | 3/1992 | Houston | 257/347 |
| 5,115,289 A | * | 5/1992 | Hisamoto et al. | 257/347 |
| 5,130,770 A | * | 7/1992 | Blanc et al. | 257/347 |
| H1435 H | * | 5/1995 | Cherne et al. | 257/347 |
| 5,616,935 A | * | 4/1997 | Koyama et al. | 257/347 |
| 5,623,155 A | * | 4/1997 | Kerber et al. | 257/347 |
| 5,821,575 A | * | 10/1998 | Mistry et al. | 257/347 |
| 5,920,085 A | * | 7/1999 | Han et al. | 257/347 |
| 5,959,313 A | * | 9/1999 | Yamazaki et al. | 257/347 |
| 6,064,090 A | * | 5/2000 | Miyamoto et al. | 257/347 |
| 6,144,041 A | * | 11/2000 | Yamazaki et al. | 257/49 |
| 2001/0038097 A1 | * | 11/2001 | Inoue | 257/57 |

FOREIGN PATENT DOCUMENTS

| | | |
|---|---|---|
| JP | A-5-206468 | 8/1993 |
| JP | A-5-241131 | 9/1993 |
| JP | A-5-257166 | 10/1993 |
| JP | A-5-273589 | 10/1993 |
| JP | A-6-177386 | 6/1994 |
| JP | A-6-260643 | 9/1994 |
| JP | A-7-45832 | 2/1995 |
| JP | A-7-301825 | 11/1995 |
| JP | A-8-32072 | 2/1996 |
| JP | A-8-43852 | 2/1996 |
| JP | A-8-70049 | 3/1996 |

* cited by examiner

Primary Examiner—Mark V. Prenty
(74) Attorney, Agent, or Firm—Oliff & Berridge, PLC

(57) ABSTRACT

In a TFT including on the surface side of a substrate a channel region opposed to a gate electrode, with a gate insulating film provided therebetween, and a source-drain region connected to the channel region, and a TFT including a source-drain wiring layer electrically connected to the source-drain region, and a gate wiring layer electrically connected to the gate electrode, at least one component part composed of a conductive film or a semiconductor film, among the component parts of each TFT, is provided with a heat-radiating extension extended from the component part itself for enhancing the heat-radiating efficiency from the component part.

15 Claims, 18 Drawing Sheets

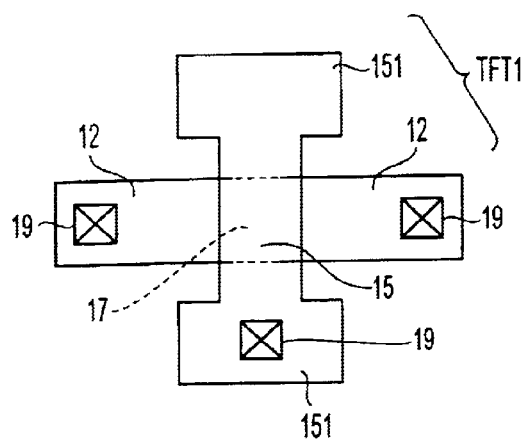
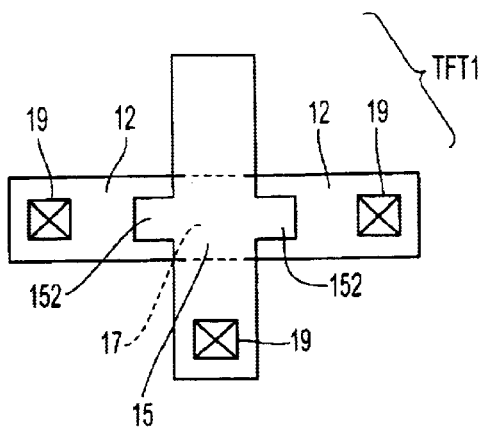
FIG. 1        FIG. 2
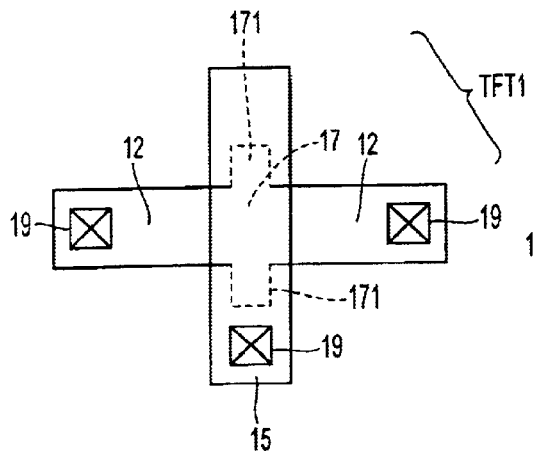
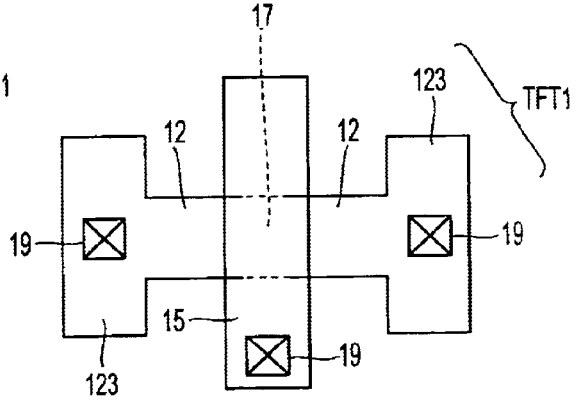
FIG. 3        FIG. 4
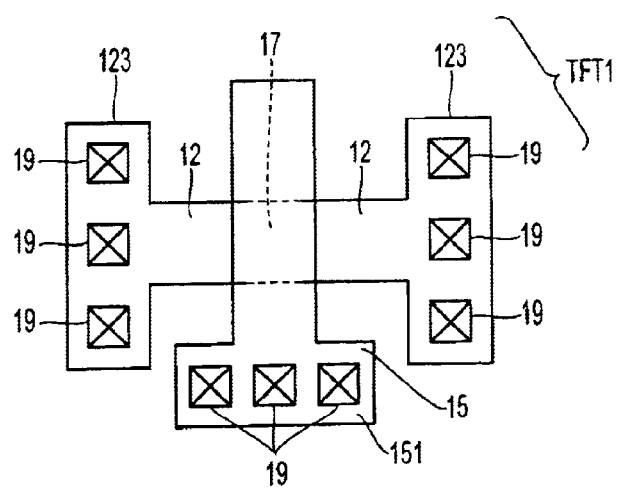
FIG. 5

| P-TYPE TFT FOR DRIVING CIRCUIT | N-TYPE TFT FOR DRIVING CIRCUIT | TFT FOR PIXEL | HOLDING CAPACITOR |

THIN FILM TRANSISTORS, AND LIQUID CRYSTAL DISPLAY DEVICE AND ELECTRONIC APPARATUS USING THE SAME

BACKGROUND OF THE INVENTION

1. Field of the Invention

The present invention relates to thin film transistors (hereinafter referred to as "TFTs"), a liquid crystal display device and an electronic apparatus using an active matrix substrate provided with driving circuits including the TFTs. In particular, the present invention also relates to structural techniques for enhancing an efficiency of heat radiation from the TFTs.

2. Description of Related Art

TFTs and a TFT circuit widely used as an active matrix substrate for a liquid crystal display device are formed so that, as shown in FIG. 14 and FIG. 15, gate electrode 15Q, source-drain region 12Q and channel region 17Q each have an almost rectangular plane shape without extending in its side direction. In addition, in each TFT 1Q in FIG. 15, silicon films forming source-drain region 12Q and channel region 17Q are patterned in an independent insular shape. Here, when various types of TFT circuits are formed from TFTs, a wiring layer 801Q formed to have a uniform width is used to mutually connect the TFTs.

In a TFT circuit having a conventional structure, increasing the current flowing in the TFT 1Q in order to improve its characteristics and performance increases the temperature of the channel region 17Q due to the self-heating of the TFT 1Q, which causes problems such as deterioration in the characteristics and a decline in reliability.

Accordingly, there can be proposed a method for suppressing the temperature rise of the TFT by providing a high thermal-conducting layer between layers included the TFT 1Q and using it as a heat-radiating layer. This method however has a problem in which, when an active matrix substrate or the like is produced, the step of forming a film used as a heat-radiating layer, and the step of patterning the film are added. Such additional production steps are undesirable because they increase the production cost.

In FIG. 14 and FIG. 15 showing the related art, the contact hole 19 is formed in each source, drain and gate region having a uniform width. When one side of the contact hole is larger than each source, drain or gate region, there may be a case in which each region is enlarged more than the uniform-width portion only around the contact hole, which, however, does not consider the heat radiation characteristics and results in no improvement thereof.

SUMMARY OF THE INVENTION

In view of the foregoing problems, an object of the present invention is to provide: a TFT circuit having a structure for enhancing the heat radiation efficiency without increasing the number of production steps, in which its characteristics do not deteriorate and its reliability does not decline; and a liquid crystal display device provided with an active matrix substrate using the TFT circuit as a driving circuit.

In order to solve the foregoing problems, the present invention provides: a TFT including on the surface side of a substrate a channel region opposed to a gate electrode, with a gate insulating film provided therebetween, and a source-drain region connected to the channel region; and a TFT having a source-drain wiring layer electrically connected to the source-drain region, and a gate wiring layer electrically connected to the gate electrode, in which at least one component part composed of a conductive film or a semiconductor film, among the component parts of each thin film transistor, is provided with a heat-radiating extension.

In other words, not by adding a new layer to TFTs, but by enlarging part of each component of the TFTs, the heat-radiating efficiency from the TFTs is enhanced.

According to the present invention, a heat-radiating extension is provided on at least one component composed of a conductive film or a semiconductor film among the components of the TFTs. Thus, in the plan view, the area capable of radiating heat is enlarged. Also, providing the extension enlarges the areas of side portions. In other words, the heat-radiating efficiency from the component is increased by the amount of the enlarged surface area thereof. In addition, the heat-radiating extension is composed of a film having a thermal conductivity higher than that of an insulating film such as a conductive film or a semiconductor film, which enables efficient heat radiation from the extension. Moreover, the heat-radiating extension is a portion extended from one component originally included in the TFTs. Accordingly, even when the heat-radiating extension is provided, the number of production steps cannot be increased. Therefore, the production cost of the TFT does not increase.

According to the present invention, the heat-radiating extension may be formed as a portion extending from the gate electrode at both sides.

For example, the extending portion of the gate electrode may be provided on at least one end of the gate electrode. In this case, it is preferable that the gate wiring layer is electrically connected to the extending portion of the gate electrode by a plurality of contact holes. This arrangement enables efficient heat conduction from the gate electrode to the gate wiring layer, which enhances the radiating efficiency.

In addition, the extending portion of the gate electrode may be provided in a region opposed to the channel region. This arrangement prevents the extending portion of the gate electrode from projecting out of the region where the TFT is formed, which does not hinder the high integration of the TFT. In this case, it is preferable that the extending portion of the gate electrode is provided at a location corresponding to an approximately central region in the width of the channel region. This arrangement increases the radiating efficiency of the portion of the channel width in which heating is remarkable, which enhances the effect thereof.

According to the present invention, the heat-radiating extension may be formed as a portion extending from the channel region at both sides. In this case, it is preferable that the extending portion of the channel region is provided in a region opposed to the gate electrode. This arrangement prevents the extending portion of the channel region from projecting out of the region where the TFT is formed, which does not hinder the high integration of the TFT.

According to the present invention, the heat-radiating extension may be formed as a portion extending from the source-drain region to both sides. In this case, it is preferable that the source-drain wiring layer is electrically connected to the extending portion of the source-drain region by a plurality of contact holes. This arrangement enables efficient heat conduction from the source-drain region to the source-drain wiring layer, which enhances the radiating effect.

According to the present invention, the heat-radiating extension may be formed as an extending portion extended from the source-drain region at both sides so that, in a CMOS inverter circuit including the thin film transistors, which are an inversely conductive type, the adjacent source-drain regions of the thin film transistors are connected between CMOS circuits. In this case, it is preferable that the heat-radiating extension is provided with conductivity by using an impurity identical to the impurity of the source-drain region to which the extension itself is connected. This structure causes the radiating extension itself to show the function of redundant wiring. In addition, it is preferable that the radiating extension is formed in a region opposed to the source-drain wiring layer for connecting the adjacent source-drain regions of the thin film transistors between the CMOS circuits. This structure prevents the radiating extension from projecting out of the source-drain interconnection layer, which does not hinder the high integration of the CMOS inverter circuit.

According to the present invention, the heat-radiating extension may be formed as an extending portion from at least either of the source-drain wiring layer and the gate wiring layer at both sides.

The TFTs in which the heat-radiating efficiency is increased in the above manner are suitable for forming a driving circuit on an active matrix substrate for a liquid crystal display device.

BRIEF DESCRIPTION OF DRAWINGS

FIG. 1 is a plan view of a TFT included in a TFT circuit according to Embodiment 1 of the present invention.

FIG. 2 is a plan view of a TFT included in a TFT circuit according to Embodiment 2 of the present invention.

FIG. 3 is a plan view of a TFT included in a TFT circuit according to Embodiment 3 of the present invention.

FIG. 4 is a plan view of a TFT included in a TFT circuit according to Embodiment 4 of the present invention.

FIG. 5 is a plan view of a TFT included in a TFT circuit according to Embodiment 5 of the present invention.

DETAILED DESCRIPTION OF PREFERRED EMBODIMENT

Figure 6:
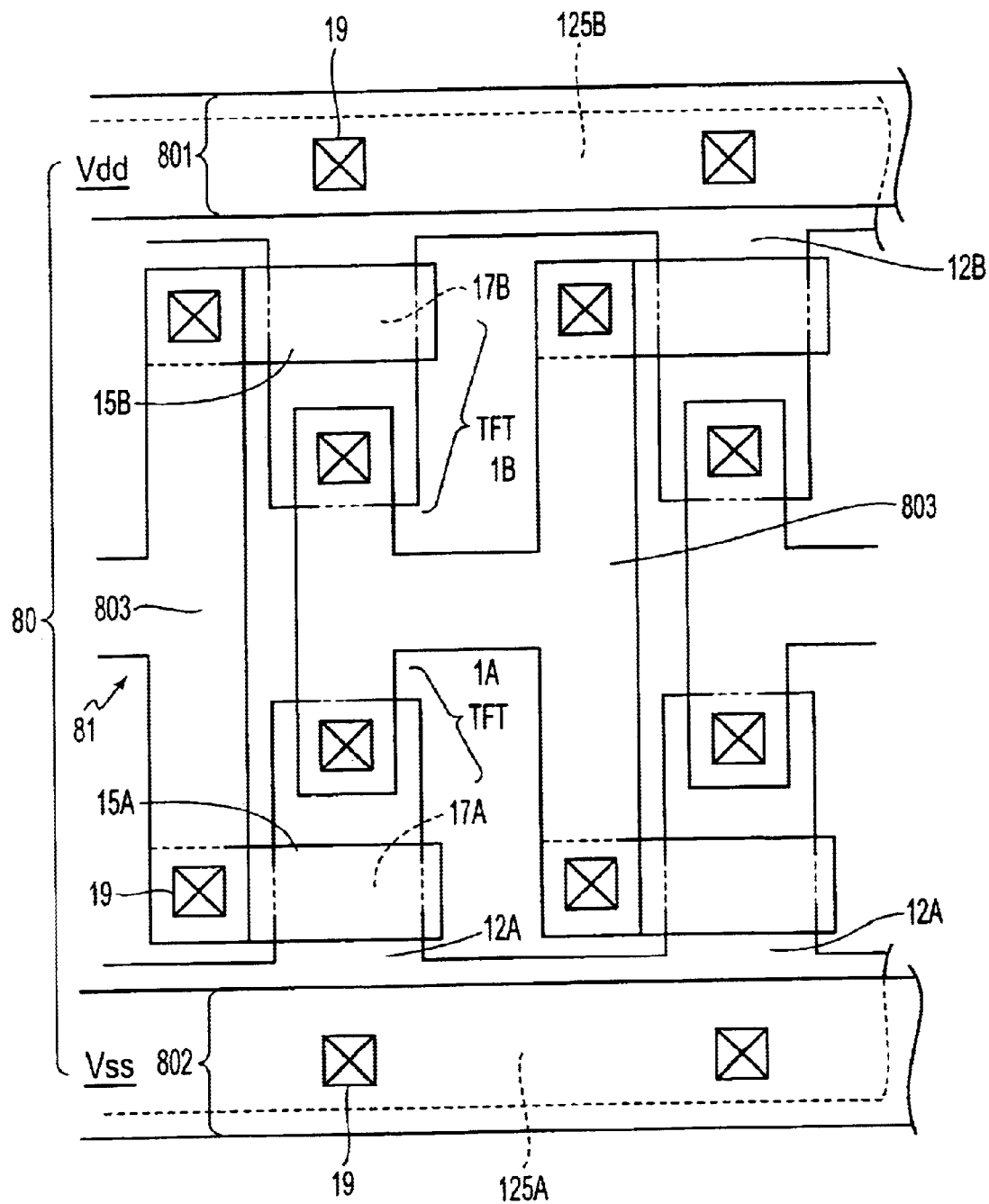
FIG. 6 is a plan view of a CMOS inverter circuit according to Embodiment 6 of the present invention.

Embodiments of the present invention will be described with reference to the drawings. In the following description, portions having a common function are denoted by an identical reference numeral in order to avoid repetitive explanation.

Embodiment 1

FIG. 1 is an explanatory expanded view showing the plane structure of a TFT used for a TFT circuit according to Embodiment 1. In TFT 1 shown in this figure, among gate electrode 15, channel region 17 opposed thereto with a gate insulating film (not shown) provided therebetween, and source-drain region 12 connected to the channel region 17, the gate electrode 15 is provided with extensions 151 (radiating extensions) extending from its ends at both sides along the channel longitudinal direction. 19 denotes contact holes used so that wiring layers (not shown) such as a source-drain wiring layer and a gate wiring layer can be electrically connected to the source-drain region 12 and the gate electrode 15.

In the TFT 1 having the above structure, the extensions 151 are provided on the gate electrode 15, which is composed of a metal film (aluminum layer/conductive film) having a higher thermal conductivity than that of a silicon oxide film or silicon film. Thus, in the plan view, the area capable of heat-radiating is enlarged. In addition, providing the extensions 151 on the gate electrode 15 enlarges the areas of its side portions. In other words, the radiation efficiency of the TFT 1 is increased by the amount of the enlarged surface area of the gate electrode 15. Therefore, even if the current flowing in the TFT 1 is increased, a rise in the temperature of the channel region 17 can be suppressed. In addition, for improving the structure of the TFT 1, it is only required that, for example, the pattern of a resist mask 92 be changed in steps described below with reference to FIGS. 13 (B), (C). Thus, the number of production steps does not increase.

Embodiment 2

FIG. 2 is an explanatory expanded view showing the plane structure of a TFT used for a TFT circuit according to Embodiment 2. In the TFT 1 shown in this figure, among gate electrode 15, channel region 17, and source-drain region 12, the gate electrode 15 is provided with extensions 152 (heat-radiating extensions) extending from its central portion at both sides along the channel longitudinal direction. Here, the extensions 152B are narrower than the channel width and are positioned almost in the center of the width of the channel region 17. 19 denotes contact holes used so that wiring layers (not shown) such as a source-drain wiring layer and a gate wiring layer can be electrically connected to the source-drain region 12 and the gate electrode 15.

Even in the TFT 1 having the above structure, similarly to Embodiment 1, the extensions 152 are provided on the gate electrode 15, which is composed of a metal film (aluminum layer/conductive film) having a higher thermal conductivity than that of a silicon oxide film or silicon film. Thus, in the plan view, the area capable of heat-radiating is enlarged. In addition, providing the extensions 152 on the gate electrode 15 enlarges the areas of its side portions. In other words, the heat radiation efficiency of the TFT 1 is increased by the amount of the enlarged surface area of the gate electrode 15. Therefore, even if the current flowing in the TFT 1 is increased, a rise in the temperature of the channel region 17 can be suppressed. In addition, for improving the structure of the TFT 1, it is only required that, for example, the pattern of a resist mask 92 be changed in steps described below with reference to FIGS. 13(B), (C). Thus, the number of production steps does not increase.

Moreover, since the extensions 152, which are narrower than the channel width, are provided so as to extend from the gate electrode 15 in the center of the width of the channel region 17, the heat-radiating efficiency of the center in the channel width direction in which heating is most remarkable can be increased. Therefore, an advantage for suppressing a rise in the temperature of the TFT 1 is enhanced.

In addition, the extensions 152 do not project out of the region where the TFT 1 is formed, which does not hinder the high integration of TFT 1.
Embodiment 3

FIG. 3 is an explanatory expanded view showing the plane structure of a TFT used for a TFT circuit according to Embodiment 3. In the TFT 1 shown in this figure, among gate electrode 15, channel region 17, and source-drain region 12, the channel region 17 is provided with extensions 171 (heat-radiating extensions) extending from its central portion at both sides along the extending direction (channel width direction) of the gate electrode 15. Here, the extensions 171 are narrower than the width of the gate electrode 17 and are positioned almost in the center of the width of the gate electrode 15. 19 denotes contact holes used so that wiring layers (not shown) such as a source-drain wiring layer and a gate wiring layer can be electrically connected to the source-drain region 12 and the gate electrode 15.

In the TFT 1 having the above structure, the extensions 171 are provided on the channel region 17, which is composed of a silicon film (semiconductor film) having a higher thermal conductivity than that of a silicon oxide film. Thus, in the plan view, the area cable of heat-radiating is enlarged. In addition, providing the extensions 171 on the channel region 17 enlarges the areas of its side portions. In other words, the heat-radiating efficiency of the TFT 1 is increased by the amount of the enlarged surface area of silicon film corresponding to the channel region 17. Therefore, even if the current flowing in the TFT 1 is increased, a rise in the temperature of the channel region 17 can be suppressed. In addition, for improving the structure of the TFT 1, it is only required that, for example, a mask pattern used when silicon films 20A, 20B are formed from silicon film 200 be changed in steps described below with reference to FIGS. 12(A), (B). Thus, the number of production steps does not increase.

The extensions 171 do not project out of the region where the TFT 1 is formed, which does not hinder the high integration of TFT 1.
Embodiment 4

FIG. 4 is an explanatory expanded view showing the plane structure of a TFT used for a TFT circuit according to Embodiment 4. In the TFT 1 shown in this figure, among gate electrode 15, channel region 17, and source-drain region 12, the source-drain region 12 is provided with extensions 123 (heat-radiating extensions) extending from its ends at both sides along the extending direction of the gate electrode 15. 19 denotes contact holes used so that wiring layers (not shown) such as a source-drain wiring layer and a gate wiring layer can be electrically connected to the source-drain region 12 and the gate electrode 15.

In the TFT 1 having the above structure, the extensions 123 are provided on the source-drain region 12, which is composed of a silicon film having a higher thermal conductivity than that of a silicon oxide film. Thus, in the plan view, the area capable of heat-radiating is enlarged. In addition, providing the extensions 123 in the source-drain region 12 enlarges the areas of its side portions. In other words, the heat-radiating efficiency of the TFT 1 is increased by the amount of the enlarged surface area of the source-drain region 12. Therefore, even if the current flowing in the TFT 1 is increased, a rise in the temperature of the channel region 17 can be suppressed. In addition, for improving the structure of the TFT 1, it is only required that, for example, a mask pattern used when silicon films 20A, 20B are formed from silicon film 200 be changed in steps described below with reference to FIGS. 12(A), (B). Thus, the number of production steps does not increase.
Embodiment 5

FIG. 5 is an explanatory expanded view showing the plane structure of a TFT used for a TFT circuit according to Embodiment 5. In the TFT 1 shown in this figure, among gate electrode 15, channel region 17, and source-drain region 12, the gate electrode 15 is provided with an extension 151 (heat-radiating extensions) extending from its ends at both sides, similarly to Embodiment 1. Accordingly, the TFT 1 has the extension 151 provided on the gate electrode 15, which is composed of a metal film having a thermal conductivity higher than a silicon oxide film or a silicon film. Thus, the heat-radiating efficiency of the TFT 1 is increased by the amount of the enlarged surface area of the gate electrode 15.

In addition, this embodiment has a structure in which an wiring layer (gate wiring layer not shown) are electrically connected to the extension 151 of the gate electrode 15 by three contact holes 19 formed in an interlayer insulating film (not shown) on the surface of the extension 151. Since a glass substrate having a low thermal conductivity is on the lower side of the TFT 1, the heat-radiating efficiency from the TFT is low, while the wiring layer has a high efficiency of thermal conductivity and heat-radiating efficiency because it is on the upper side of the interlayer insulating film 51 and is composed of a metal layer. Accordingly, this embodiment has efficient thermal conduction from the gate electrode 15 to the wiring layer and efficient heat-radiating from the wiring layer by the amount of the broad contact area between the gate electrode 15 and the wiring layer, which can prevent a rise in the temperature of the TFT 1.

In addition, similarly to Embodiment 4, the source-drain region 12 is provided with extensions 123 (heat-radiating extensions) extending from its ends at both ends along the extending direction of the gate electrode 15. Accordingly, the TFT 1 has the extensions 123 provided on the source-drain region 12, which is composed of a silicon film having a thermal conductivity higher than that of a silicon oxide film. Thus, the heat-radiating efficiency of the TFT 1 is increased by the amount of the enlarged surface area of the source-drain region 12.

Moreover, this embodiment has a structure in which a wiring layer (source-drain wiring layer not shown) is electrically connected to the extensions 123 of the source-drain region 12 by three contact holes 19 formed in the interlayer insulating film (not shown) formed in each extension surface. Since a glass substrate having a low thermal conductivity is on the lower side of the TFT 1, the heat-radiating efficiency from the TFT is low, while the wiring layer has a high efficiency of thermal conductivity and heat-radiating efficiency because it is on the upper side of the interlayer insulating film and is composed of a metal layer. Accordingly, according to this embodiment, this embodiment has efficient thermal conduction from the source-drain region 12 to the wiring layer and efficient heat-radiating from the wiring layer by the amount of the broad contact area between the source-drain region 12 and the wiring layer, which can prevent a rise in the temperature of the TFT 1.

Although, in FIG. 5, three contact holes are formed in each extension of the source-drain region and each extension of the gate electrode, the number of contact holes has no limit, and a plurality of contact holes may be combined to form one large contact hole.

Embodiment 6

FIG. 6 is an explanatory enlarged view showing the plane structure of a CMOS inverter circuit according to Embodiment 6. According to CMOS inverter circuit (TFT circuit) 80, in any P-type TFT 1B included in CMOS circuit 81 at each stage, drain region 12B is electrically connected to wiring layer (source-drain wiring layer) 801 consisting of an aluminum layer supplied with voltage Vdd by contact holes 19, and in any N-type TFT 1A, source region 12A is electrically connected to wiring layer (source-drain wiring layer) 802 consisting of an aluminum layer supplied with voltage Vss by the contact holes 19.

In addition, gate electrodes 15A, 15B consisting of the aluminum layers of the N-type and P-type TFT 1A, 1B at each stage are electrically connected to input/output wiring layer (gate wiring layer) 803 by the contact holes 19, and this wiring layer 803 is electrically connected to the source region 12A of the N-type TFT 1A and the drain region 12B of the P-type TFT 1B in N-type and P-type TFT 1A and 1B included in the previous stage CMOS circuit 81 by the contact holes 19.

In this embodiment, silicon films which form the source-drain regions 12A, 12B and the channel regions 17A, 17B are not separately isolated for each TFT, but the adjacent identical-conductive-type source-drain regions 12A of the TFT 1A are connected by extension 125A extended from the source-drain regions 12A, and the adjacent identical-conductive-type source-drain regions 12B of the TFT 1B are connected by extension 125B extended from the source-drain regions 12B. Here, the extensions 125A, 125B are formed such that the silicon films integrated with the total of the source-drain regions 12A, 12B and the source-drain region 12A, 12B are processed to be conductive. Thus, the adjacent source-drain regions 12A and the adjacent source-drain regions 12B are connected in shape and electrically. Accordingly, the extensions 125A, 125B also have the function of redundant wiring with respect to the wiring layers 801, 802, and the function of reducing wiring resistance.

The CMOS inverter circuit 80 having the above structure have the extensions 125A, 125B provided on the source-drain regions 12A, 12B, which are composed of a silicon film having a thermal conductivity higher than that of a silicon oxide film. Thus, in the plan view, the area capable of heat-radiating is enlarged. In addition, providing the extensions 125A, 125B on the source-drain regions enlarges the area of their side portions 125A, 125B. In other words, the heat-radiating efficiency of the TFT 1A, 1B is increased by the amount of the enlarged surface areas of the source-drain regions 12A, 12B. In addition, for improving the CMOS inverter circuit 80, it is only required that, for example, a mask pattern for patterning silicon film 20 to form silicon films 20A, 20B be changed in steps described below with reference to FIGS. 12(A), (B), which does not increase the number of production steps.

In addition, in FIG. 6, the extensions 125A, 125B, and the wiring layers 801, 802 are shifted so that the existence of the extensions 125A, 125B are clearly shown. However, by completely superimposing them, there is generated an advantage in which the formation of the extensions 125A, 125B does not hinder the high integration of the CMOS inverter circuit 80.

Embodiment 7

Figure 7A:
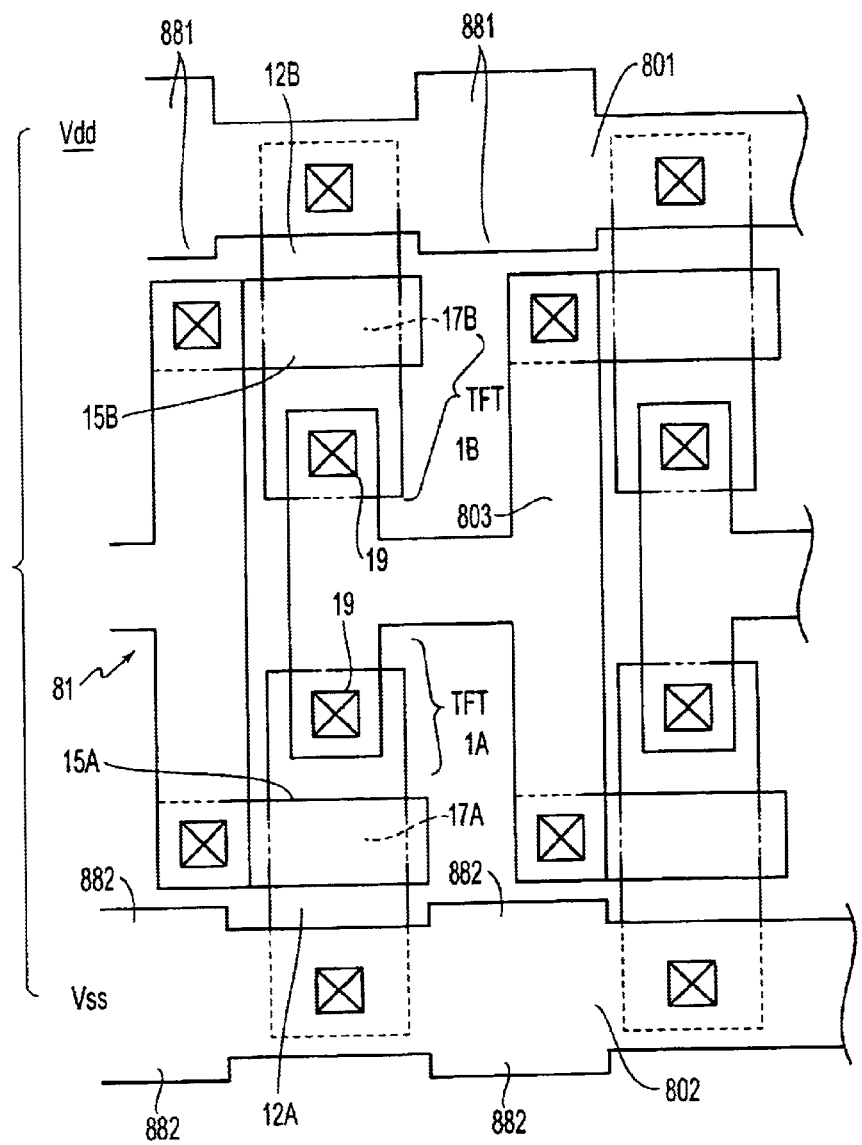
In FIG. 7, (A) is a plan view of a CMOS inverter circuit according to Embodiment 7 of the present invention, and (B) is a chart illustrating the case that a radiation efficiency is increased in another wiring.

FIG. 7(A) is an explanatory enlarged view showing the plane structure of a CMOS inverter circuit according to Embodiment 7. In the CMOS inverter circuit 80 shown in this figure, both wiring layer (source-drain wiring layer) 801 for electrically connecting the adjacent source-drain regions 12B of P-type TFT 1B, and wiring layer (source-drain wiring layer) 802 are provided with extensions 881, 882 (extensions for heat-radiating) extending at both sides.

In the TFT 1A, 1B having the above structure, the wiring layers 801, 802, which are composed of a metal film having a thermal conductivity higher than that of a silicon oxide film or a silicon film, have the extensions 881, 882. Thus, in the plan view, the area capable of heat-radiating is enlarged. In addition, providing the extensions 881, 882 enlarges the areas of their sides. In other words, since the surface areas of the wiring layers 801, 802 are enlarged, the heat-radiating efficiency thereof increases. Accordingly, the heat from the TFT 1A, 1B is conducted to the wiring layers 801, 802 through the source-drain regions 12A, 12B, and is efficiently radiated therefrom. Therefore, a rise in the temperature of the TFT 1A, 1B can be prevented. In addition, for improving the CMOS inverter circuit 80 in such a manner, it is only required that, for example, a mask pattern used when the interconnection layers 801, 802 are formed by patterning in a step described below with reference to FIG. 11 be changed, which does not increase the number of production steps.

This embodiment has described the case that the wiring layers 801, 802 are provided with the extensions 881, 882. However, wiring layer (gate wiring layer) 803 electrically connected to the gate electrodes 15A, 15B of the N-type and P-type TFT 1A, 1B may be provided with similar heat-radiating extensions.

Figure 7B:
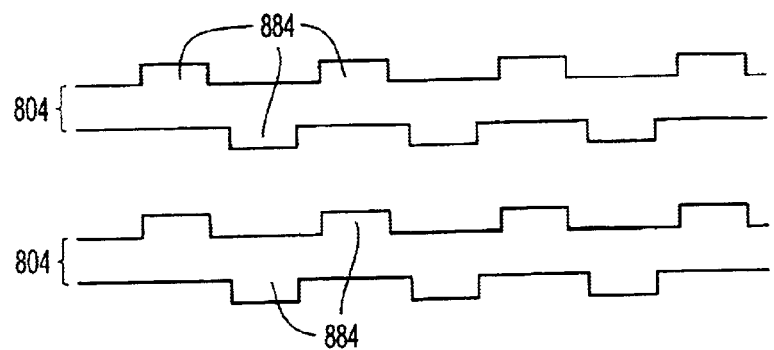

In addition, it need hardly be said that not only the wiring layers 801, 802, 803 but also other wiring layers 804 may be provided with heat-radiating extensions 884, as shown in FIG. 7(B). If heat-radiating efficiency can be increased, there is no limit in the position and shape of extensions.

Other Embodiments

Concerning the foregoing Embodiments 1 to 7, cases having respective characteristics have been described. However, the foregoing Embodiments 1 to 7 may be arbitrarily combined. For example, even in the case that the wiring layers 801, 802 according to Embodiment 7 are used in the CMOS inverter circuit 80 according to Embodiment 6, heat-radiating efficiency from TFTs can be enhanced without increasing the number of production steps. Also, in the case that the TFT 1 having a structure according to Embodiment 1 to 5 is used in CMOS inverter circuit 80 having the structure of Embodiment 6, 7 or a combination thereof, heat-radiating efficiency in the TFT circuit can be enhanced without increasing the number of production steps.

Application to Active Matrix Substrate

The case that the present invention is applied to an active matrix substrate for a liquid crystal display device will be described with reference to the drawings.

Whole Structure of Active Matrix Substrate

Figure 8:
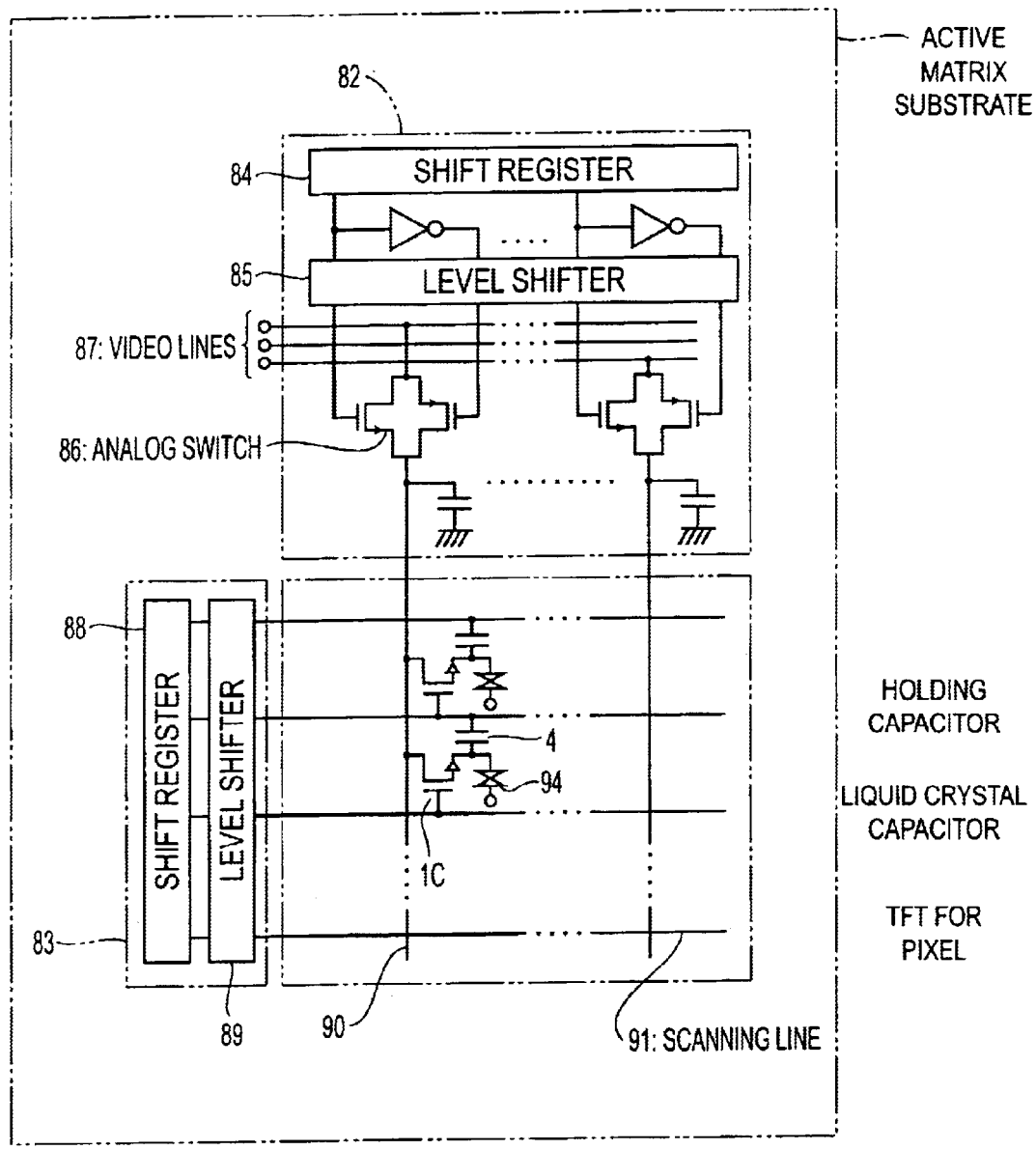
FIG. 8 is a block diagram showing the schematic structure of an active matrix substrate for a liquid crystal display device.

FIG. 8 is a block diagram showing the schematic structure of an active matrix substrate for a liquid crystal display device.

As shown in FIG. 8, according to the active matrix substrate for a liquid crystal display device, on a transparent substrate composed of glass or the like, each pixel region is formed by signal lines 90 and scanning lines 91 composed of a metal film made of aluminum etc., where there are liquid crystal capacitors (liquid crystal cells) 94 to which video signals are input via TFTs 1C for pixels. A data driving circuit (TFT circuit) 82 including a shift register 84, a level shifter 85, video lines 87 and analog switches 86 is formed for the signal lines 90. A scanning driving circuit (TFT circuit) 83 including a shift register 88 and a level shifter 89 is formed for the scanning lines 91. In the pixel region is formed holding capacitors 4 between it and the previous stage scanning lines 91, and the holding capacitors 4 have the function of enhancing the charge holding characteristics of the liquid crystal capacitors 94.

Basic Structure of CMOS Inverter Circuit

Figure 9A:
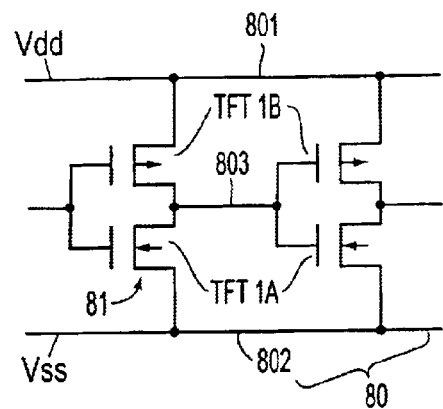
In FIG. 9, (A) is a circuit diagram of a CMOS inverter circuit formed in a data driving circuit or a scanning driving circuit in the active matrix substrate shown in FIG. 8, and (B) is a plan view showing TFTs and a wiring layer included in this CMOS inverter circuit.

In the data-side and scanning-side driving circuits, for example, as a two-stage CMOS inverter circuit 80 is shown in FIG. 9(A), a CMOS circuit 81 consists of an N-type TFT 1A and a P-type TFT 1B. According to the CMOS circuit 81, an inverter circuit consists of one stage or two or higher stages.

Figure 9B:
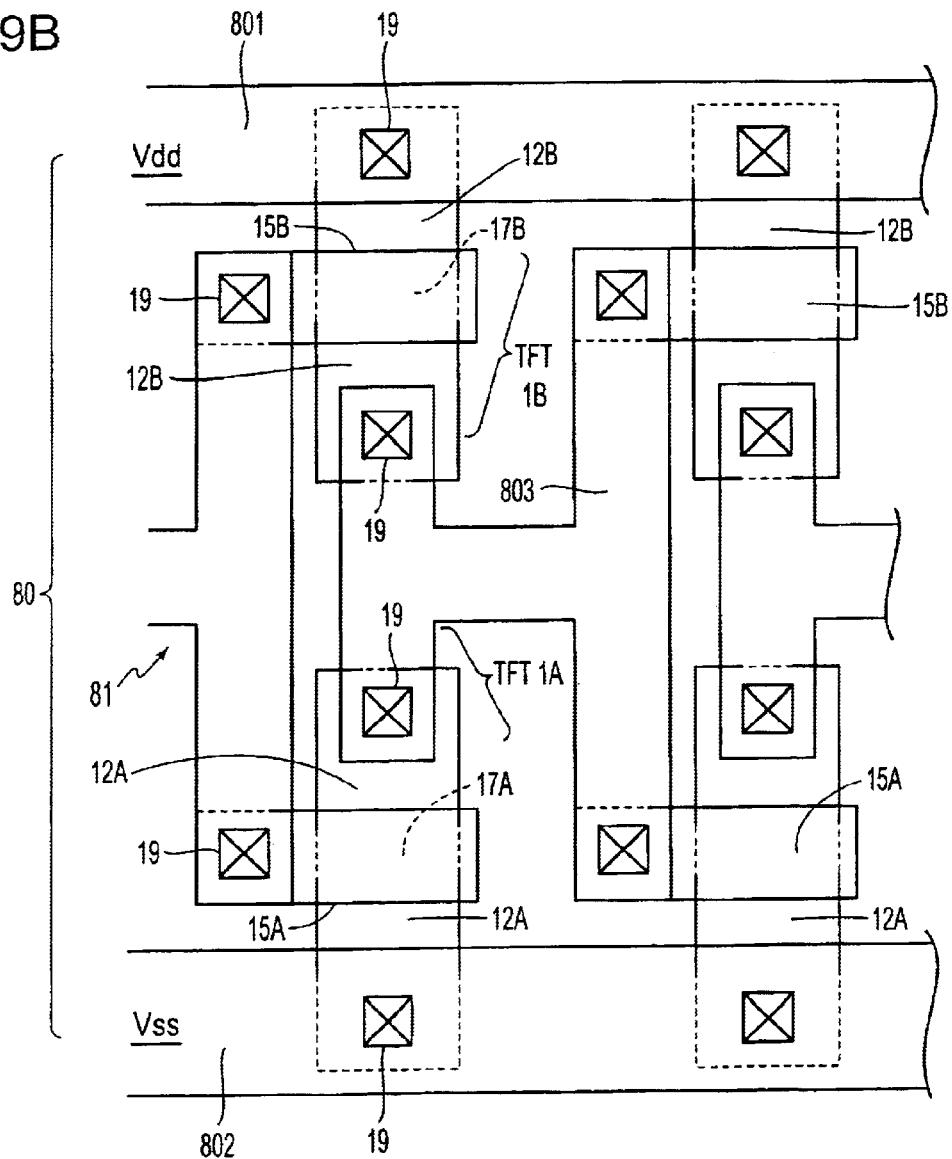

In FIG. 9(B) is shown one example of the basic plane structure of the CMOS inverter circuit 80 included in the data-side and scanning-side driving circuits. In this figure, in the P-type TFT 1B included in the CMOS circuit 81 at each stage, source-drain regions 12A, 12B are electrically connected via contact holes 19 to a wiring layer (source-drain wiring layer) 801 composed of an aluminum layer supplied with voltage Vdd. In the N-type TFT 1A, source-drain regions 12A, 12B are electrically connected via contact holes 19 to a wiring layer (source-drain wiring layer) 802 composed of an aluminum layer 802 supplied with voltage Vss.

In addition, the gate electrodes 15A and 15B of the N-type and P-type TFT 1A and 1B, composed of aluminum layers, at each stage, are electrically connected to an input/output wiring (gate wiring layer) 803 by contact holes 19, and the wiring layer 803 is electrically connected by contact holes 19 to the source-drain regions 12A and 12B of the N-type TFT and the drain region 12B of the P-type TFT 1B in the P-type and N-type TFTs included in CMOS circuit 81 at the previous stage.

In FIG. 9(B) is shown a general structure concerning the structure of each TFT and a wiring structure. In a TFT circuit as formed in such a manner, a CMOS inverter circuit having the wiring structure described in Embodiment 6 or 7 may be used. In addition, concerning a TFT as a component, the structure described in Embodiments 1 to 5 may be used.

Basic Structure of Pixel Region

Figure 10:
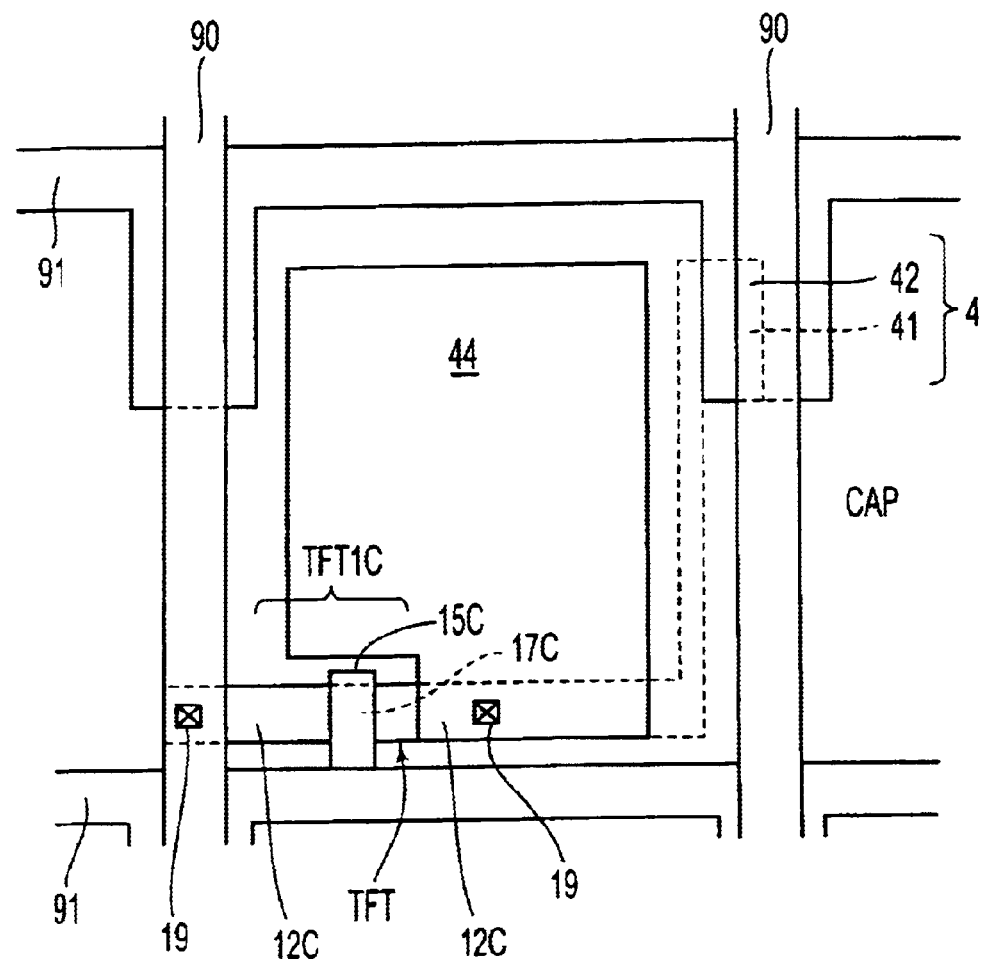
FIG. 10 is an enlarged plan view showing one pixel region formed by sectioning the active matrix substrate shown in FIG. 8.

As shown in FIG. 10, in the pixel region, data lines (wiring layer) 90 and a pixel electrode 44 composed of an ITO film are electrically connected to the source-drain region 12C of TFT 1C for the pixel by contact holes 19. Also, in the pixel region, the holding capacitor 4 has a lower electrode 41 formed by providing conductivity to a semiconductor film simultaneously formed when a semiconductor film (silicon film) for forming TFT 1C for the pixel is formed. An upper electrode 42 simultaneously formed when a gate electrode 15 is formed, extending from the previous-stage scanning line 91, overlaps with the lower electrode 41. There may be a case in which the holding capacitor 4 is formed between the scanning line 91 and a simultaneously formed exclusive capacitor line.

Section Structure of Each TFT and Holding Capacitor

Figure 11:
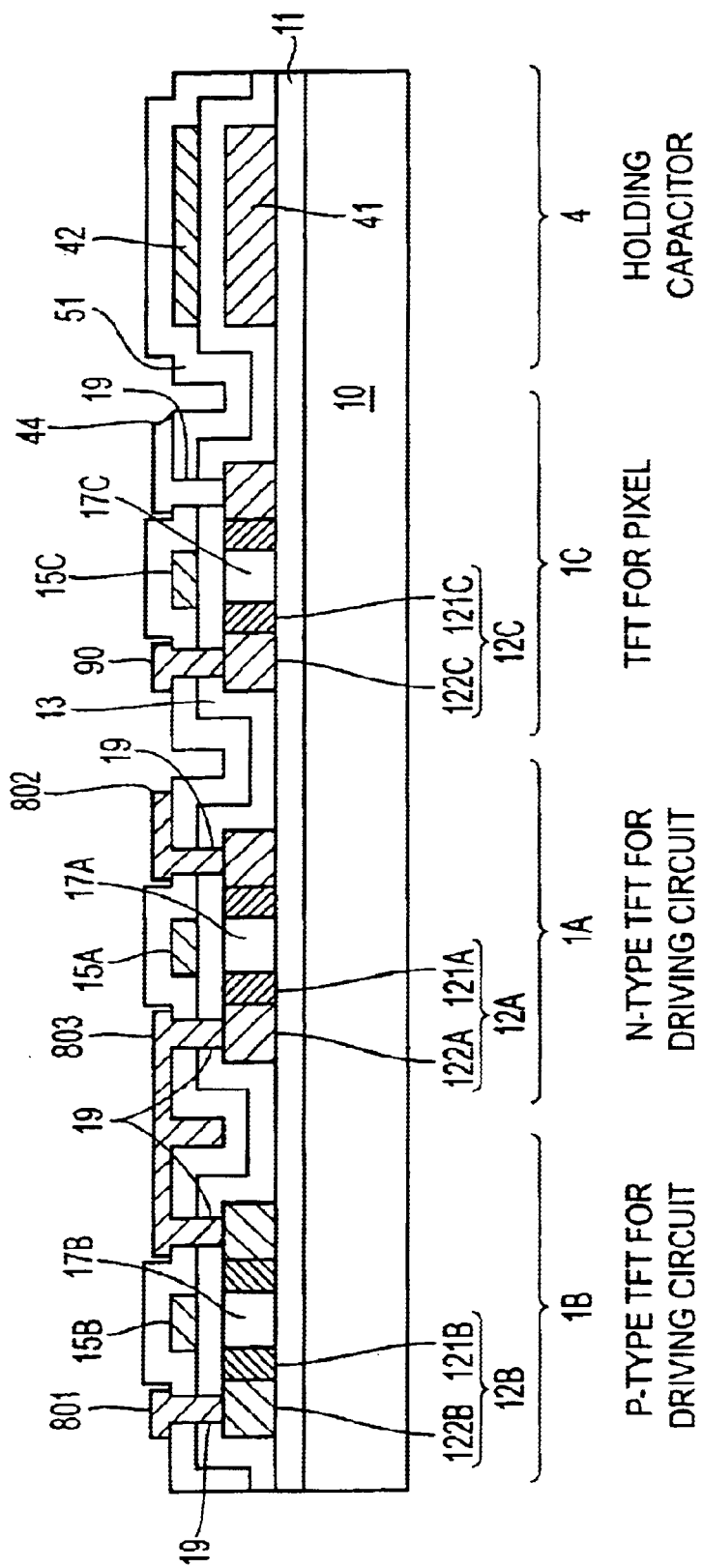
FIG. 11 is a section view showing three types of TFTs and a holding capacitor formed on the active matrix substrate shown in FIG. 8.

In this manner, on the active matrix substrate used for the liquid crystal display device, each region is provided with the TFT. The P-type TFT 1B for the driving circuit, the N-type TFT 1A for the driving circuit, and the TFT 1c for the pixel have the same basic section structure so that any of the TFTs can be fabricated in a common production step, as shown in FIG. 11. In other words, any of the TFTs 1A, 1B and 1C has: the channel regions 17A, 17B and 17C opposed to the gate electrodes 15A, 15B and 15C, with the gate insulating film 13 composed of a silicon oxide film, provided therebetween; and the source-drain regions 12A, 12B and 12C connected to the channel regions 17A, 17B and 17C.

The N-type TFT 1A for the driving circuit, among the TFTs 1A, 1B and 1C, has a structure in which the wiring layer 802 on the top surface of the interlayer insulating film 51 composed of a silicon oxide film is connected to the source-drain region 12A by the contact hole 19. The P-type TFT 1B has a structure in which the wiring layer 801 on the top surface of the interlayer insulating film 51 is connected to the source-drain region 12B by the contact hole 19. Between the N-type TFT 1A and the P-type TFT 1B is formed a structure in which the wiring layer 803 on the top surface of the interlayer insulating film 51 is electrically connected by the contact hole 19 to both the drain region 122A of the N-type TFT 1A and the drain region 122B of the P-type TFT 1B.

In addition, the TFT 1C for the pixel has a structure in which the data line 90 and the pixel electrode 44 on the top surface of the interlayer insulating film 51 are electrically connected to the source-drain region 12C by the contact holes 19, respectively. On the surface of the glass substrate 10 is formed an undercoat protecting film 11 composed of a silicon oxide film.

According to the active matrix substrate formed in the above manner, any of the N-type and P-type TFTs 1A and 1B for the driving circuits, the TFT 1C for the pixel, and the holding capacitor 4 is not only formed on the same glass substrate 10, but also mutually uses each step for forming each device. At this time, it is preferable to form any of the TFTs 1A, 1B and 1C to have an LDD structure or an offset gate structure. Forming the TFTs 1A and 1B for the driving circuit in the LDD structure or offset gate structure can improve reliability by the amount of the increased withhold voltage. Forming the TFT 1C for pixel in the LDD structure or offset gate structure can improve the quality of image display by the amount of the reduced offset current. The present invention can be applied to any of the structures described above.

Method for Producing Active Matrix Substrate

In any of the above-described embodiments, the heat-radiating efficiency from the driving circuit (TFTs) can be enhanced without increasing the number of the production steps. Accordingly, one example of a method for producing each of the TFTs 1A, 1B and 1C on the active matrix substrate will be described with reference to FIG. 12 and FIG. 13.

Figure 12A:
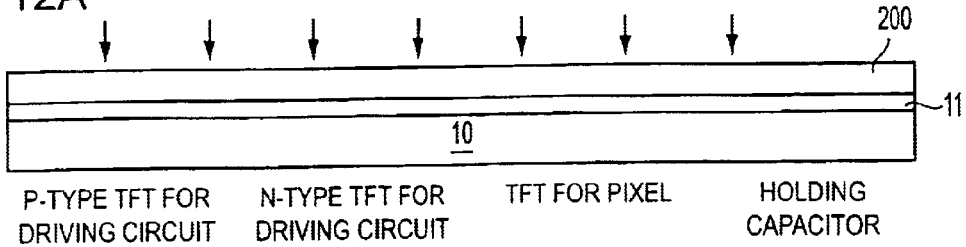
FIGS. 12 (A–F) are step section views showing one example of a method for producing the active matrix substrate shown in FIG. 11.

Initially, as shown in FIG. 12(A), an undercoat protecting film 11 composed of a silicon oxide film having a thickness of approximately 2000 angstroms is formed on a glass substrate 10, with material gases such as tetraethoxysilane (TEOS) and oxygen gas by plasma CVD techniques. Subsequently, a semiconductor film 200 composed of an amorphous silicon film having a thickness of approximately 600 angstroms is formed on the surface of the undercoat protecting film 11 by the plasma CVD techniques. Subsequently, by performing a step for crystallizing the semiconductor film 200 composed of the amorphous silicon film 200, such as laser annealing or solid-phase growth, the semiconductor film 200 is crystallized to become a polysilicon film.

According to the laser annealing, for example, a line beam in which the beam length of an excimer laser is 400 mm is used, and its output intensity is, for example, 200 mJ/cm$^2$. As for the line beam, the line beam is used for scanning so that a portion corresponding to 90% of the peak value of the laser intensity in its widthwise direction is applied to each region.

Figure 12B:
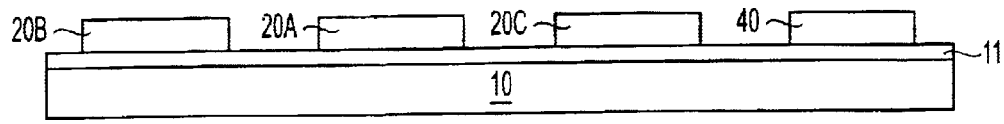

Subsequently, as shown in FIG. 12(B), the semiconductor film 200, which has changed to the polysilicon film, is patterned by using lithography techniques to form semiconductor films 20A, 20B, 20C and 40. The semiconductor films 20A, 20B, 20C and 40 are semiconductor films for forming the N-type TFT 1A for the driving circuit, the P-type TFT 1B for the driving circuit, the TFT 1C for the pixel, and the holding capacitor 4. In a period for performing the above steps, there is a case (channel dope step) in which an impurity having a low concentration is introduced for the purpose of adjusting the TFT threshold value.

Figure 12C:
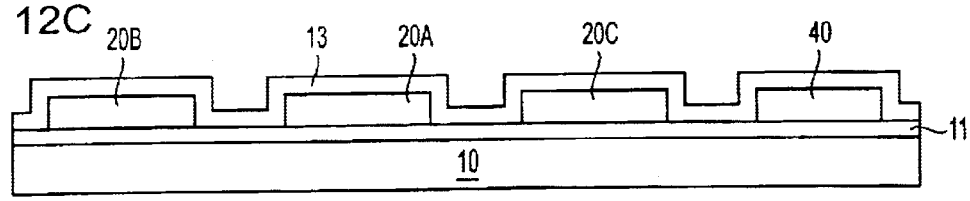

Subsequently, as shown in FIG. 12(C), a gate insulating film 13 composed of a silicon oxide film having a thickness of approximately 1000 angstroms is formed on the surfaces of the semiconductor films 20A, 20B, 20C and 40, with material gases such as TEOS and oxygen gas by plasma CVD: (gate-insulating-film formation step).

Figure 12D:
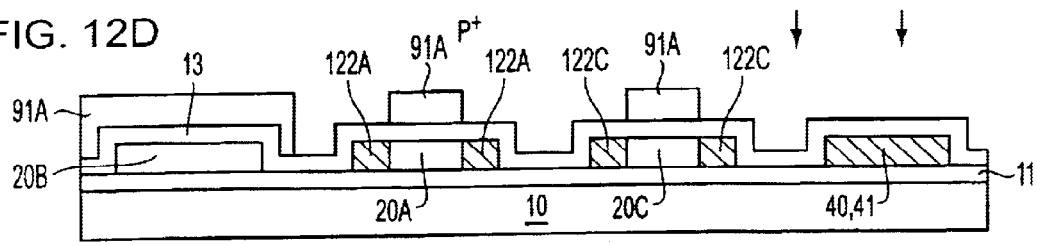

Subsequently, as shown in FIG. 12(D), resist masks 91A for covering the whole of a region in which the N-type TFT 1A for the driving circuit should be formed and covering areas slightly larger than regions in which the P-type TFT 1B for the driving circuit and the TFT 1C for the pixel should be formed are formed. In this condition, phosphorus ions (N-type impurity) are introduced into the semiconductor films 20A, 20C and 40 at a dose of approximately $2\times10^{15}$ cm$^{-2}$: (high-concentration-N-type-impurity introduction step). As a result, phosphorus ion-doped regions on the semiconductor films 20A and 20C become high-concentration source-drain regions 122A and 122C. In addition, the semiconductor film 40 becomes the lower electrode 41 of the holding capacitor 4.

Figure 12E:
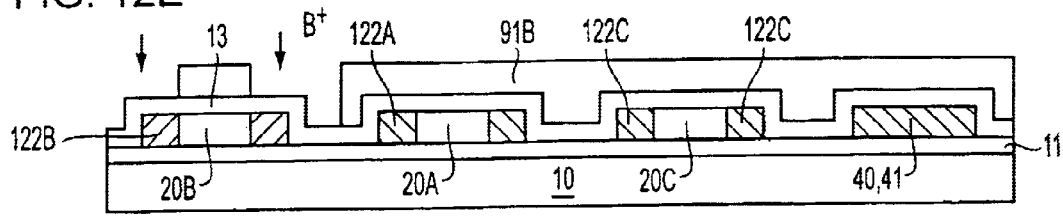

Subsequently, as shown in FIG. 12(E), resist masks 91B for covering the total regions in which the N-type TFT 1A for the driving circuit, the TFT 1C for the pixel, and the holding capacitor 4 should be formed and covering an area slightly larger than a region in which the P-type-TFT-1B gate electrode should be formed are formed. In this condition, boron ions (P-type impurity) are introduced into the semiconductor film 20B at a dose of approximately $2\times10^{15}$ cm$^{-2}$: (high-concentration-P-type-impurity introduction step). Consequently, a boron ion-doped region on the semiconductor film 20B becomes a high-concentration source-drain region 122B.

Figure 12F:
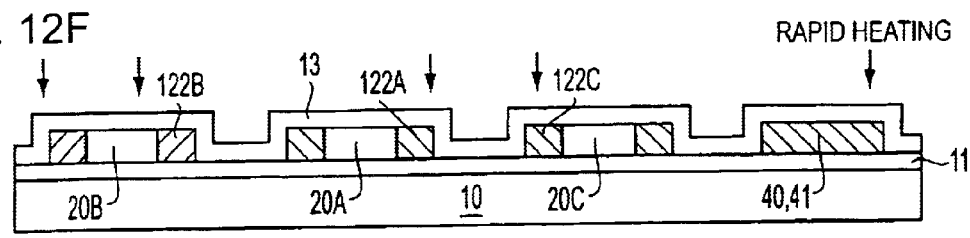

Subsequently, as shown in FIG. 12(F), by using an arc lamp to perform the rapid heating or laser annealing of the semiconductor films 20A, 20B, 20C and 40, the impurities introduced into the semiconductor films 20A, 20B, 20C and 40 are activated: (rapid heating step).

Figure 13A:
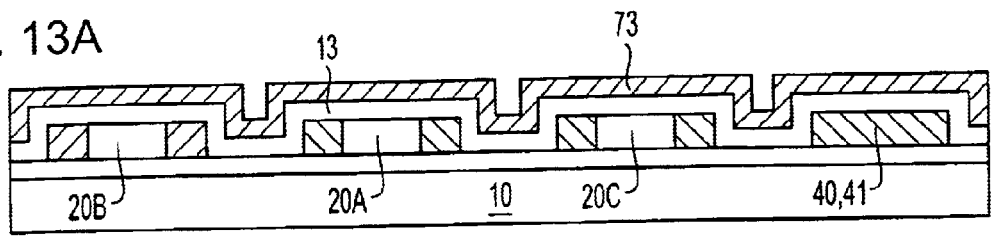
FIGS. 13 (A–F) are step section views showing steps subsequent to the steps shown in FIG. 12 of the one example of the method for producing the active matrix substrate shown in FIG. 11.

After finishing the above rapid heating step, as shown in FIG. 13(A), a conductive film 73 composed of a film of metal like aluminum is formed by sputtering: (conductive-film formation step).

Figure 13B:
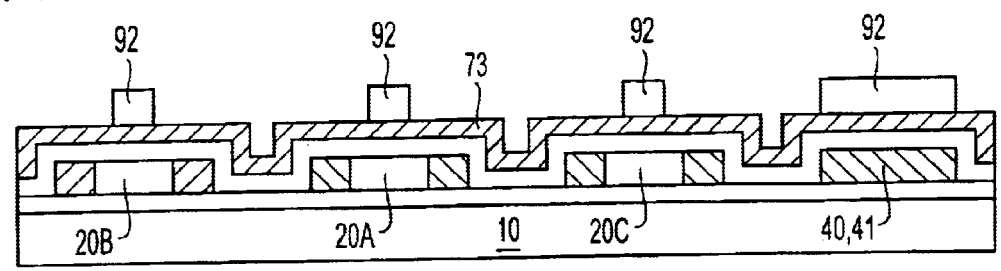
Figure 13C:
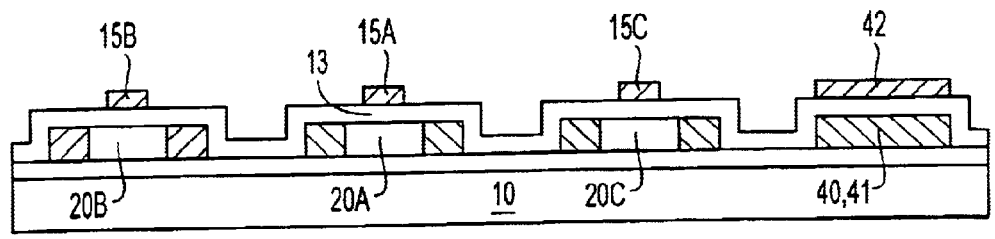

Subsequently, after forming resist masks 92 on the surface of the conductive film 73 as shown in FIG. 13(B), the patterning of the conductive film 73 is performed to form the gate electrodes 15A, 15B and 15C of the TFTs and the upper electrode 42 of the holding capacitor 4, as shown in FIG. 13(C): (gate-electrode formation step).

Figure 13D:
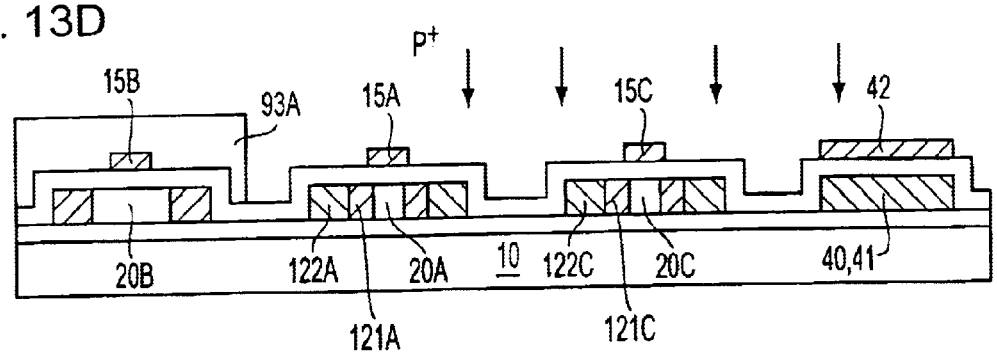

Subsequently, as shown in FIG. 13(D), after forming a resist mask 93A for covering the whole of a region in which the P-type TFT 1B for the driving circuit should be formed, low-concentration phosphorus ions (N-type impurity) are introduced using phosphine (PH$_3$) diluted with water or the like at a dose of approximately $1\times10^{13}$ cm$^{-2}$: (low-concentration-N-type-impurity introduction step). Hydrogen ions are also introduced into the semiconductor films 20A and 20C at a dose of approximately $2\times10^{13}$ cm$^{-2}$. Portions into which the impurity has not been introduced become channel regions 17A and 17C. Consequently, on the same substrate are formed the N-type TFT 1A for the driving circuit and the N-type TFT 1C for the pixel. The TFTs have an LDD structure in which low-concentration source-drain regions 121A and 121C in the source-drain regions 12A and 12C are opposed to ends of the gate electrodes 15A and 15C. Omitting the introduction of such a low-concentration N-type impurity causes the TFT 1A and 1C to have an offset gate structure.

Figure 13E:
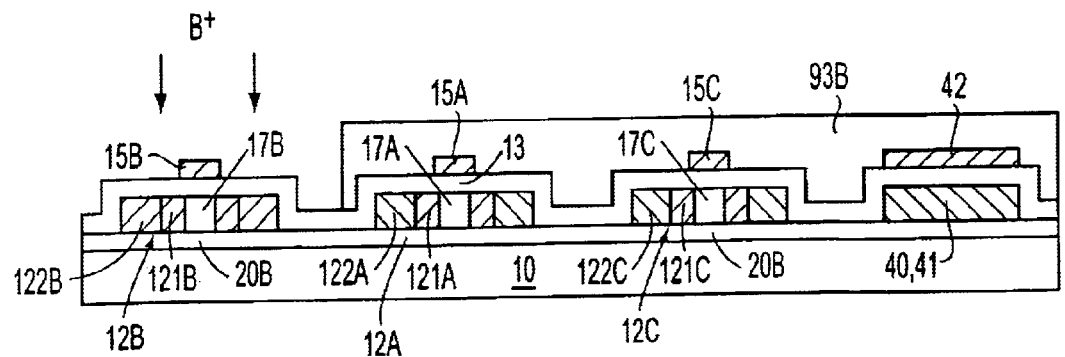

Subsequently, as shown in FIG. 13(E), after forming a resist mask 93B for covering the N-type TFT 1A for the driving circuit, the TFT 1C for the pixel, and the holding capacitor 4, hydrogen gas-diluted diboron (B$_2$H$_6$) or the like is used to introduce boron ions (P-type impurity) having a low concentration at a dose of approximately $1\times10^{13}$ cm$^{-2}$: (low-concentration-P-type-impurity introduction step). Hydrogen ions are also introduced into the semiconductor film 20B at a dose of approximately $2\times10^{13}$ cm$^{-2}$. A portion into which the impurity has not been introduced becomes the channel region 17B. Consequently, the P-type TFT 1B for the driving circuit is formed on the substrate 10. This TFT has an LDD structure in which a low-concentration P-type source-drain region 12B in the source-drain region 20B is opposed to one end of the gate electrode 15B. Omitting the introduction of the low-concentration P-type impurity causes the TFT 1B to have an offset gate structure.

Figure 13F:
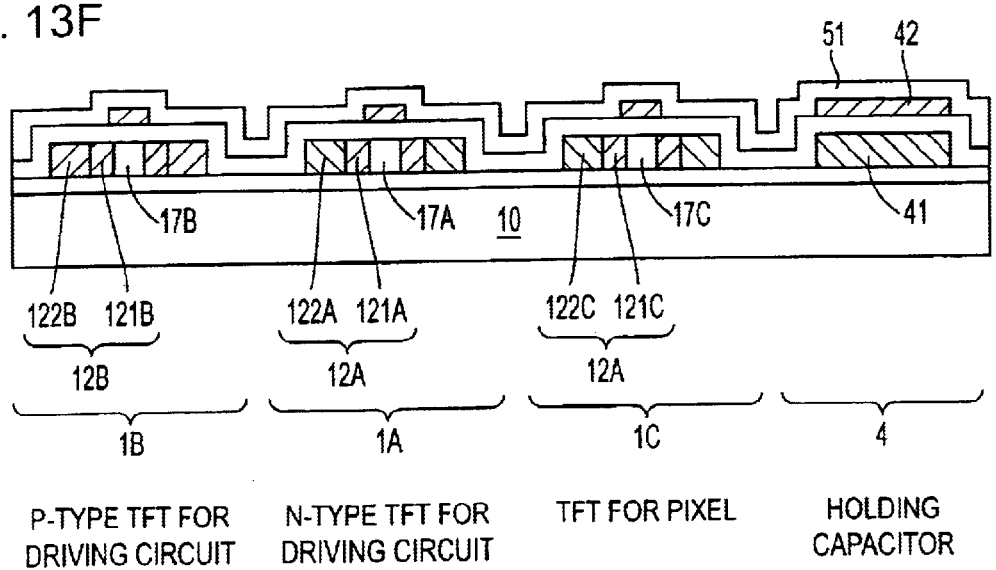
Figure 14:
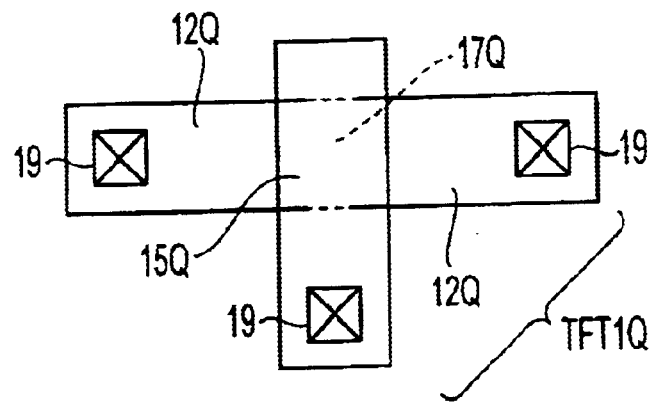
FIG. 14 is a plan view of a conventional TFT.
Figure 15:
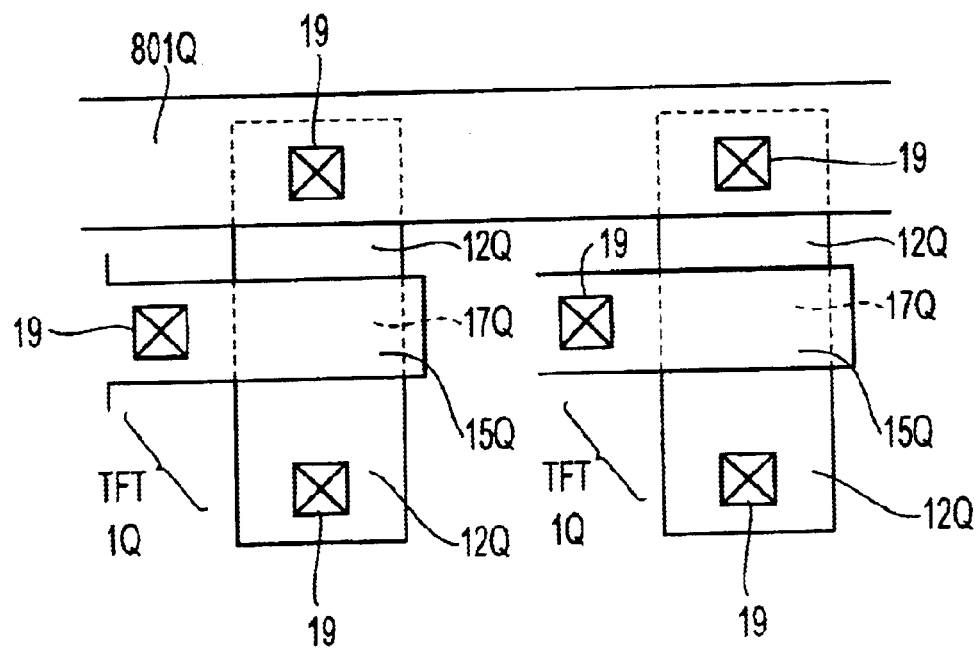
FIG. 15 is a plan view of TFTs included in a conventional TFT circuit.

Subsequently, after the low-concentration impurities introduced into the low-concentration source-drain regions 121A, 121B and 121C are activated by performing heat treatment in forming gas, an interlayer insulating film 51 composed of a silicon oxide film having a thickness of approximately 5000 angstroms is formed with material gases such as TEOS and oxygen gas by plasma CVD, as shown in FIG. 13(F). Thereafter, as shown in FIG. 11, contact holes 19 are formed in the interlayer insulating film 51, and subsequently, wiring layers 801, 802, 803 and the pixel electrode 44 are sequentially formed.

Figure 16:
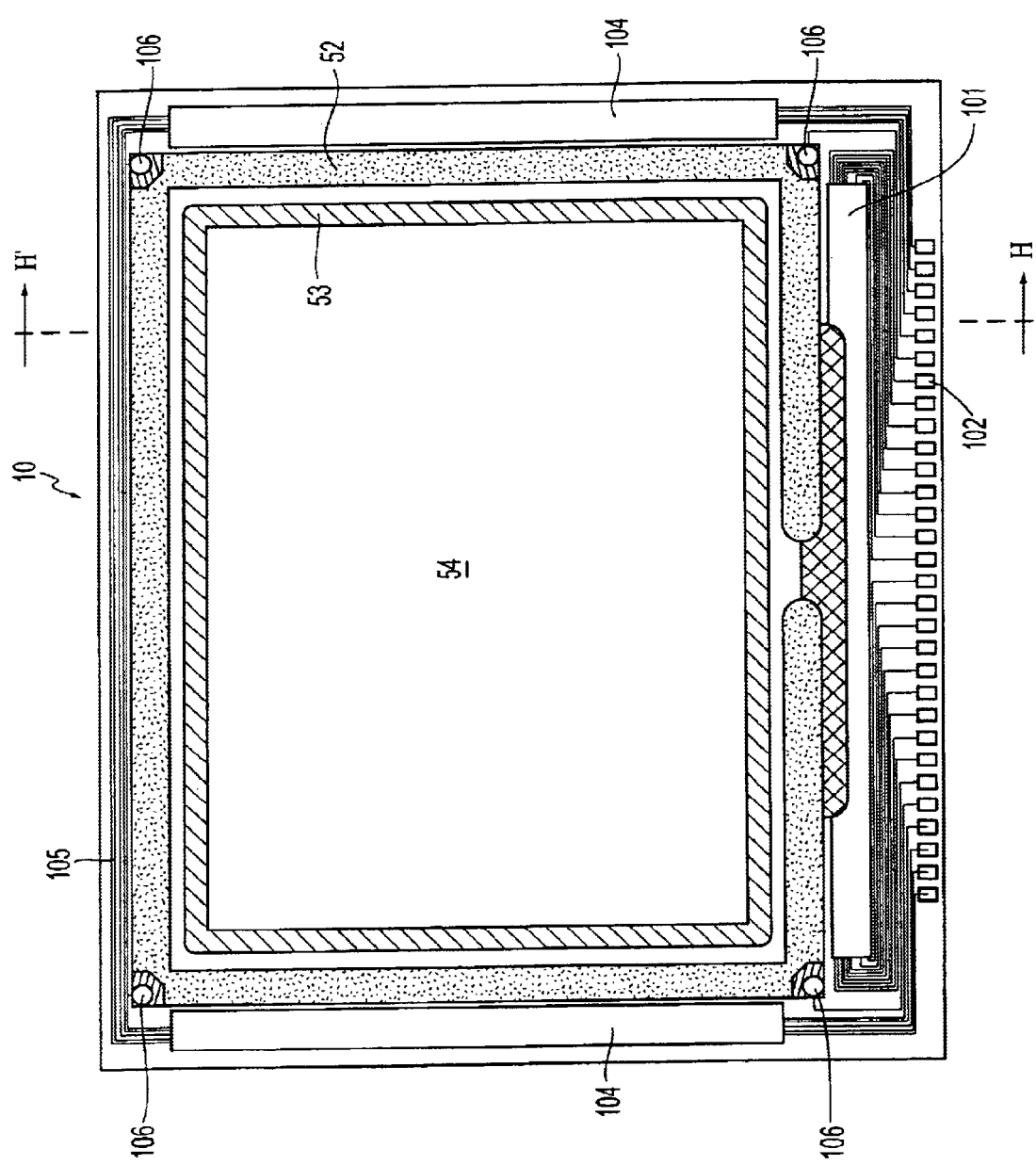
FIG. 16 is a plan view showing one example of a liquid crystal display device in which the present invention is used.
Figure 17:
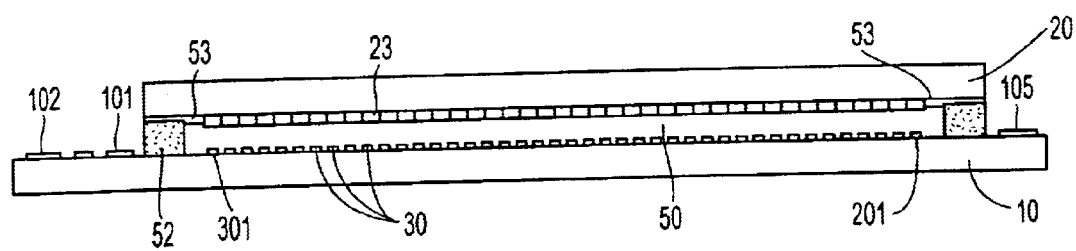
FIG. 17 is a section view of H—H' shown in FIG. 16.

The structure of the front part of a liquid crystal display device formed using the above TFTs will be described with FIG. 16 and FIG. 17. FIG. 16 is a plan view, and FIG. 17 is a view showing a section H—H' in FIG. 16. On an active matrix substrate 10 is provided along a screen display region 54 a sealing agent 52 composed of photocurable material, as one example of a sealing member for surrounding a liquid crystal layer 50 when two substrates are bonded to each other around the screen display region 54 (namely, a liquid-crystal-panel region on which an actual image is displayed by a change in the orientation of the liquid crystal layer 50) defined by a plurality of pixel electrodes 11. In addition, on a counter substrate 20, a light-shielding peripheral frame is provided between the screen display region and the sealing agent 52.

In a region outside the sealing agent 52 are provided along the bottom side of the screen display region a data-line driving circuit 101 and mounting terminals 102. Scanning-line driving circuits 104 are provided along the right and left sides of the screen display region on both sides of the screen display region. On the top side of the screen display region are further provided a plurality of wiring 105 for connecting the scanning-line driving circuits 104 provided on the right and left sides of the screen display region. In the four corners of the sealing agent 52 are provided silver points 106 composed of a conductive agent for establishing electrical conduction between the active matrix substrate 10 and the counter substrate 20.

Figure 18:
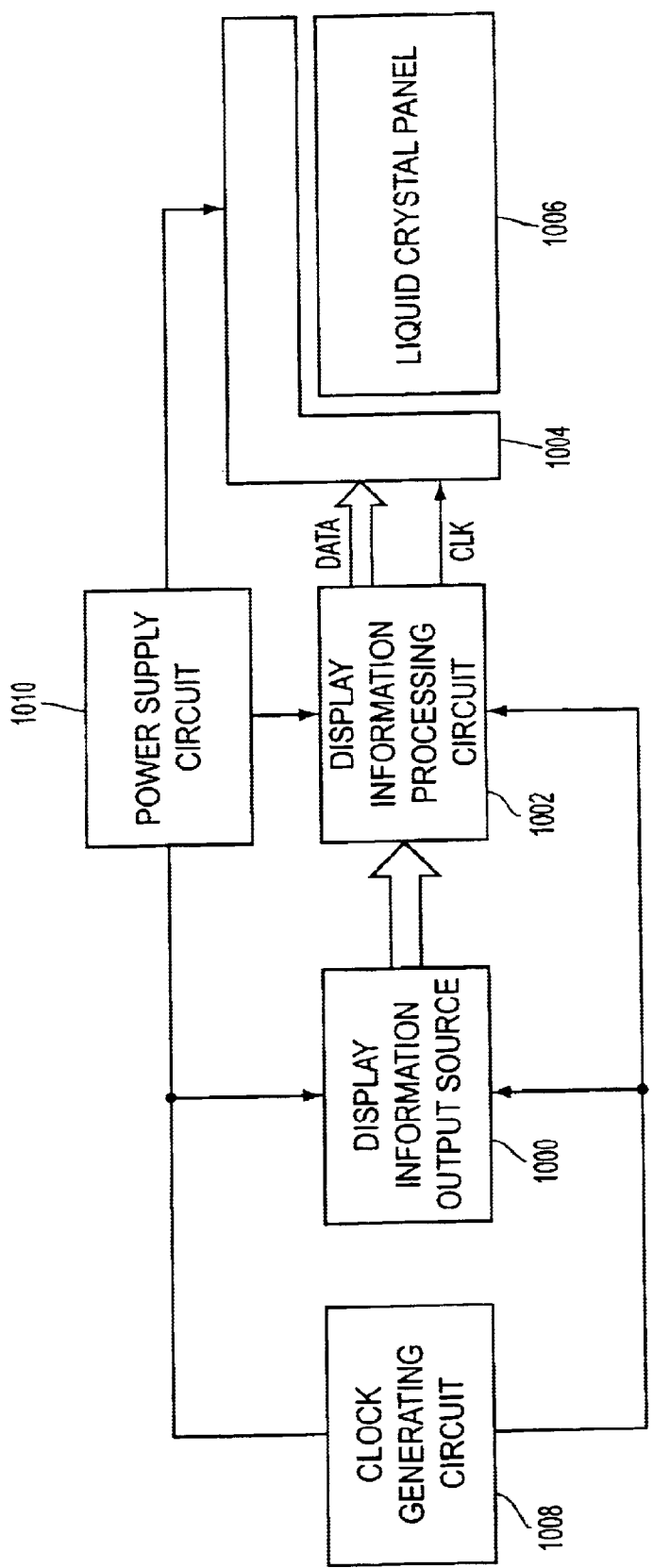
FIG. 18 is a block diagram showing the outline of an embodiment of an electronic apparatus according to the present invention.

An electronic apparatus using the liquid crystal display device in the foregoing Embodiments includes a display-information output source 1000, a display-information processing circuit 1002, a display driving circuit 1004, a display panel 1006 such as a liquid crystal panel, a clock generating circuit 1008, a power supply circuit 1010, as shown in FIG. 18. The display-information output source 1000 includes memories such as a ROM and a ROM, and a tuning circuit for outputting a tuned television signal, and outputs display information like a video signal, based on a clock from the clock generating circuit 1008. The display-information processing circuit 1002 processes display information, based on a clock from the clock generating circuit 1008 before outputting it. The display-information processing circuit 1002 may include, for example, an amplifying and polarity-inverting circuit, a phase expanding circuit, a rotation circuit, a gamma correction circuit or a clamping circuit. The display driving circuit 1004 includes a scanning driving circuit and a data driving circuit, and activates the liquid crystal panel 1006 for display. The power supply circuit 1010 supplies power to each circuit described above.

Figure 19:
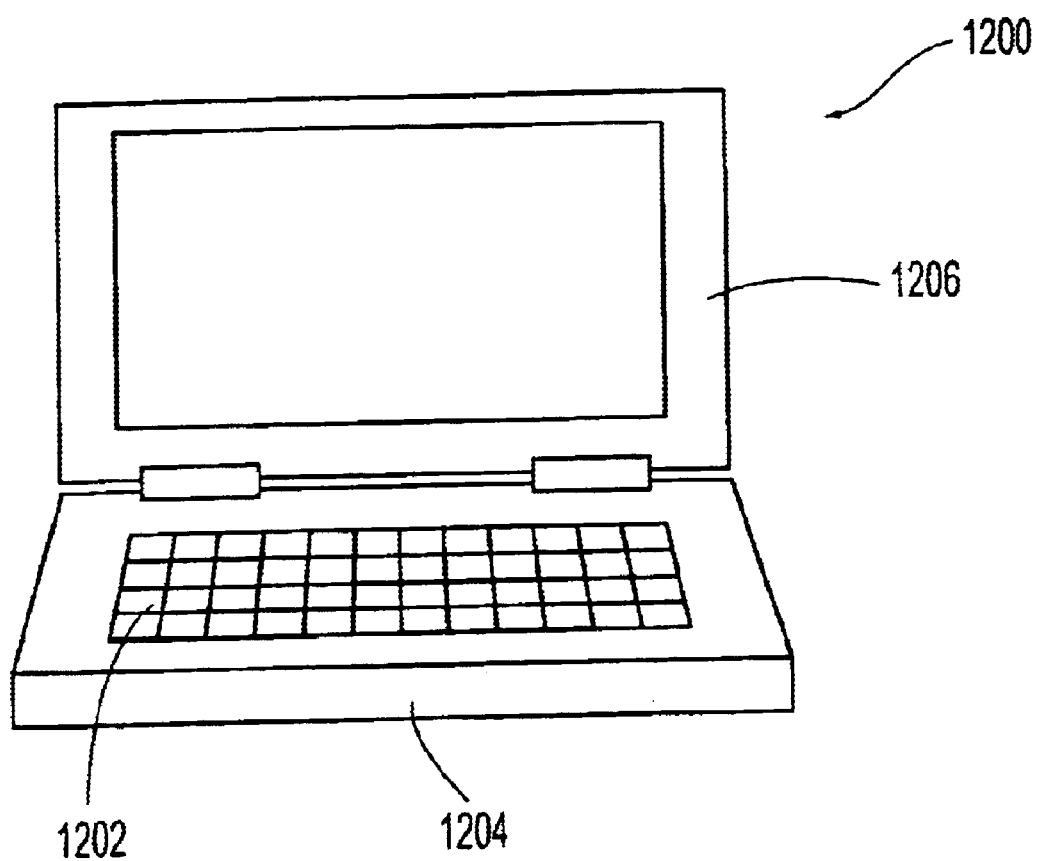
FIG. 19 is a front view showing a personal computer as one example of an electronic apparatus.
Figure 21:
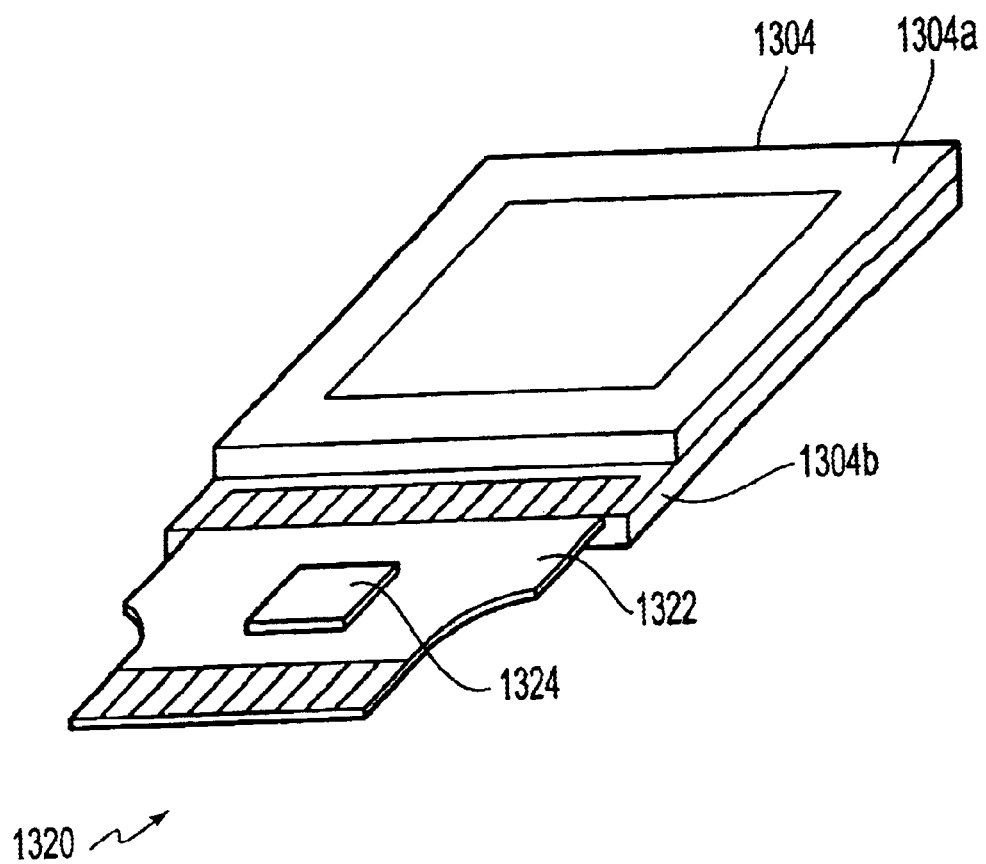
FIG. 21 is a perspective view showing a liquid crystal display device using TCP as one example of an electronic apparatus.
Figure 22:
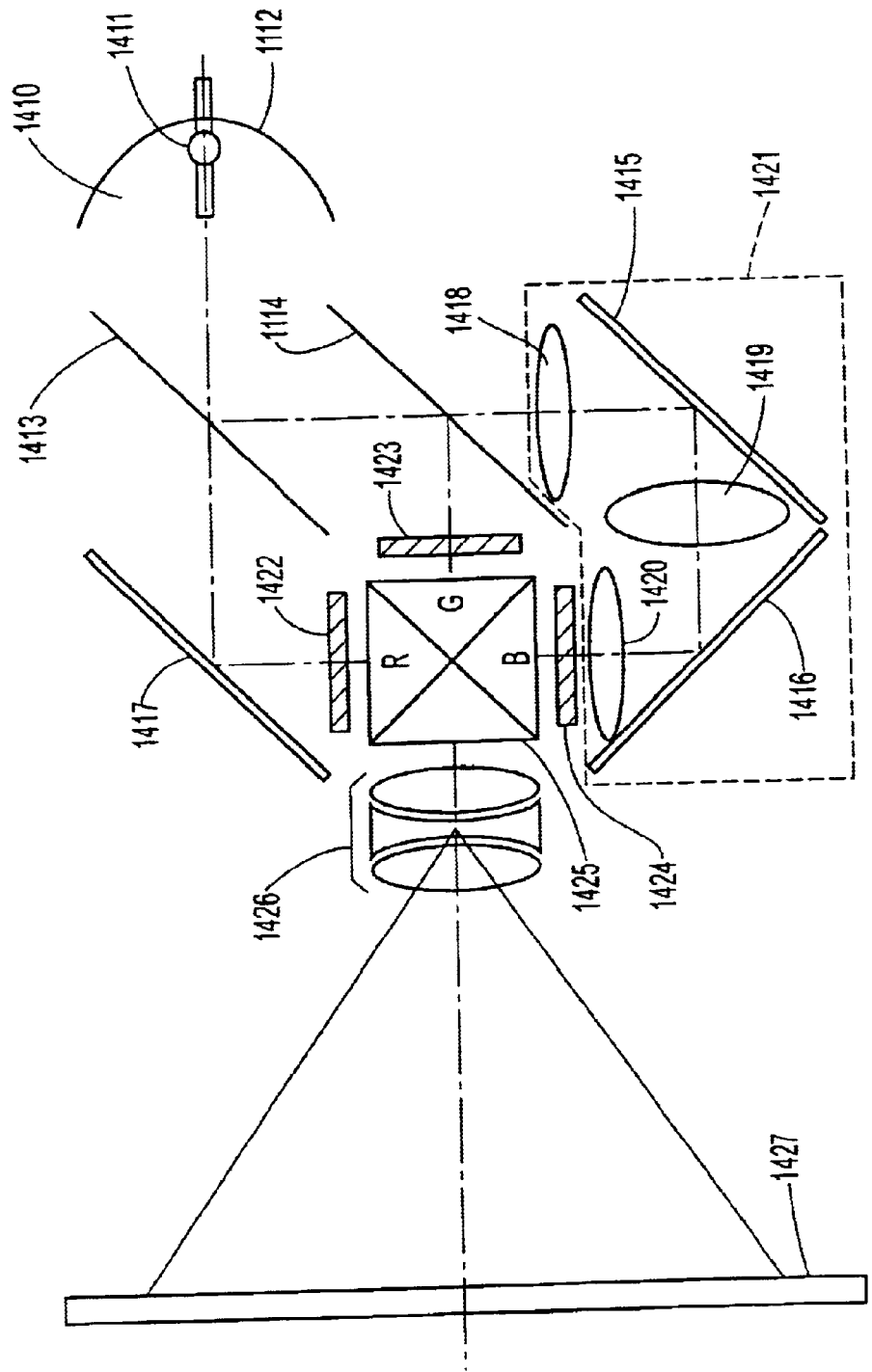
FIG. 22 is a concept chart showing the prism optical system of combining three color rays: RGB for a liquid crystal display device.

Electronic apparatuses having such a structure include a projector shown in FIG. 22, a personal computer (PC) and an engineering workstation (EWS) shown in FIG. 19, adapted for multimedia, a pager shown in FIG. 21, a portable telephone, a word processor, a television, a view-finder-type or monitor-direct-view type videotape recorder, an electronic notebook, an electronic desktop calculator, a car navigation apparatus, a POS terminal, and an apparatus provided with a touch panel.

FIG. 22 is a schematic view showing the main components of a projection-type display apparatus. In this figure, 1410 denotes a light source; 1413 and 1414 denote dichroic mirrors; 1415, 1416 and 1417 denote reflection mirrors; 1418, 1419 and 1420 denote relay lenses; 1422, 1423 and 1424 denote liquid-crystal light valves; 1425 denotes a cross dichroic prism, and 26 denotes a projecting lens. The light source 1410 includes a lamp 1411 like a metal halide lamp and a reflector 1412 for reflecting lamplight. The dichroic mirror 1413, which reflects a blue ray and a green ray, allows a red ray among white flux from the light source 1410 to pass through it, and reflects a blue ray and a green ray. The red ray having passed is reflected by the reflection mirror 1417, and is incident upon a liquid crystal light valve 1422 for red light. In addition, a green ray in the color light reflected by the dichroic mirror 13 is reflected by the dichroic mirror 1414, which reflects a green ray, and is incident upon the light valve 1423 for green light. In addition, a blue ray also passes through the second dichroic mirror 1414. For the blue ray, a light guide means 1421 including the incident lens 1418, the relay lens 1419 and the emergent lens 1420 is provided in order to prevent optical loss due to the long optical path, and the blue ray is incident upon the liquid crystal light valve 1424 for blue light by the light guide means 21. Three color rays modulated by the light valves are incident upon the cross-dichroic prism 1425. This prism is formed such that four rectangular prisms are mutually bonded, and a dielectric multilayer film for reflecting red light and a dielectric multilayer film for reflecting blue light are formed on the internal surfaces in the form of a cross. These dielectric multilayer films combine the three color rays to form light representing a color image. The combined light is projected through the projection lens 1426 onto a screen 1427, on which an enlarged image is displayed.

The personal computer 1200 shown in FIG. 19 has a body unit 1204 provided with a keyboard 1202, and a liquid-crystal display screen 1206.

Figure 20:
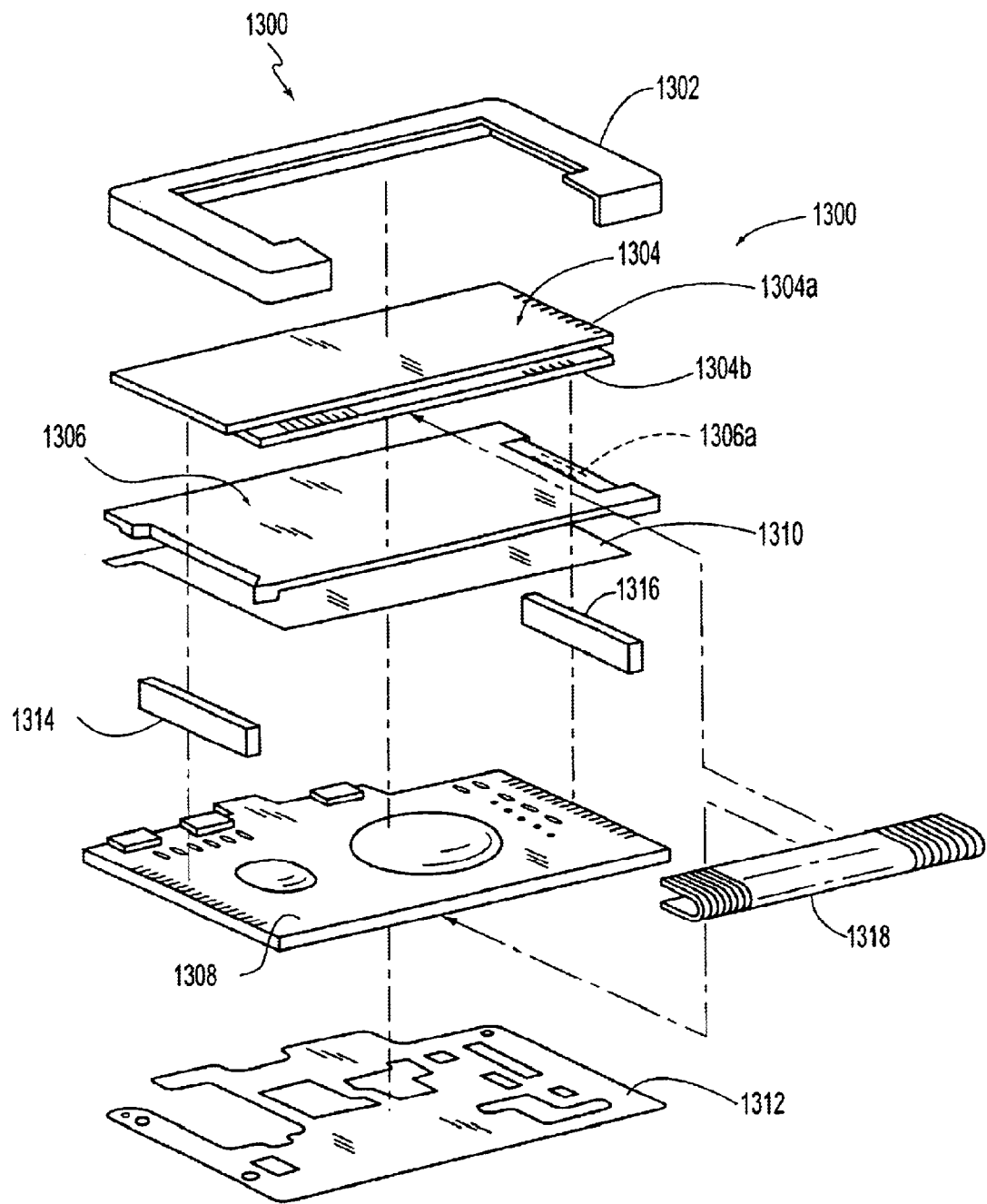
FIG. 20 is an exploded perspective view showing a pager as one example of an electronic apparatus.

The pager 1300 shown in FIG. 20 has a liquid crystal display substrate 1304, a light guide 1306 provided with a back light 1306a, a circuit substrate 1308, first and second shield sheets 1310 and 1312, two elastic conductive units 1314 and 1316, and a film carrier tape 1318, in a metal frame 1302. The two elastic conductive units 1314 and 1316, and the film carrier tape 1318 connect the liquid-crystal display substrate 1304 and the circuit substrate 1308.

Here, the liquid crystal substrate 1304 has liquid crystal provided between two transparent substrates 1304a and 1304b, so that at least a dot-matrix-type liquid crystal panel is formed. On either substrate, the driving circuit 1004 shown in FIG. 18, and the display-information processing circuit 1002 in addition thereto can be formed. A circuit not mounted on the liquid crystal substrate 1304 is used as an external circuit for the liquid crystal substrate, and can be mounted on the circuit substrate 1308 in the case in FIG. 23.

Since FIG. 20 shows the structure of the pager, the circuit substrate 1308 other than the liquid crystal substrate 1304 is needed. However, in the case that a liquid crystal display device is used as an electronic apparatus component and that a display driving circuit is mounted on a transparent substrate, the minimum unit of the liquid crystal display device is the liquid crystal substrate 1304. Otherwise, the metal frame 1302 as a casing to which the liquid crystal display substrate 1304 is fixed can be used as a liquid crystal display device as one electronic-apparatus component. In addition, in the case of a backlight type, a liquid crystal display device can be formed by incorporating in the metal frame 1302 the liquid crystal substrate 1304 and the light guide 1306 provided with the backlight 1306a. In place of these, as shown in FIG. 21, by connecting to either of two transparent substrates 1304a, 1304b included in a liquid crystal display substrate 1304 a tape carrier package (TCP) 1320 having an IC chip 1324 mounted on a metallic conductive film-formed polyimide tape 1322, the formed one can also be used as one electronic-apparatus component.

The present invention is not limited to the foregoing embodiments but may be practiced in various modified modes within the spirit thereof. For example, the present invention is not limited to the foregoing embodiments to which it is applied to the driving of various liquid crystal panels, but it may be applied to electroluminescence and plasma display devices.

Industrial Applicability

As described above, TFTs and a TFT circuit according to the present invention is characterized in that a heat-radiating extension is provided on a portion composed of a conductive film or a semiconductor film. Therefore, according to the present invention, the surface area of the portion is enlarged by the amount of the area of the heat-radiating extension. Thus, the radiating efficiency therefrom is increased. Hence, even if the current flowing in the TFTs on the TFT circuit is increased in order to improve its characteristics and performance, deterioration of the characteristics and a decline in reliability cannot be generated because an increase in temperature due to self-heating from the TFTs is reduced by the amount of the high heat-radiating efficiency. Moreover, the heat-radiating extension is one extending from one portion included in the TFT circuit. Accordingly, the number of production steps does not increase, which results in no increase in the production cost of the TFT circuit.

What is claimed is:

1. A thin film transistor including a plurality of component parts comprising:
    a channel region;
    a gate electrode opposed to the channel region;
    a gate insulating film provided between the channel region and the gate electrode;
    a source-drain region connected to said channel region;
    a source-drain wiring layer electrically connected to said source-drain region;
    a gate wiring layer electrically connected to said gate electrode,
    wherein at least one of the source-drain region and the gate electrode comprises an extension over which a plurality of contact holes are formed.

2. A thin film transistor including a plurality of component parts comprising:
    a channel region;
    a gate electrode opposed to the channel region;
    a gate insulating film provided between the channel region and the gate electrode;
    a source-drain region connected to said channel region;
    a source-drain wiring layer electrically connected to said source-drain region; and
    a gate wiring layer electrically connected to said gate electrode,
    at least one of the component parts being formed from a conductive film or a semiconductor film and being provided with a radiating extension extending outwardly from the at least one component part, said radiating extension extending outwardly from both sides of said gate electrode and is provided on at least one end of said gate electrode; and
    wherein said gate wiring layer is electrically connected to the radiating extension of said gate electrode by a plurality of contact holes.

3. A thin film transistor including a plurality of component parts comprising:
    a channel region;
    a gate electrode opposed to the channel region;
    a gate insulating film provided between the channel region and the gate electrode;
    a source-drain region connected to said channel region;
    a source-drain wiring layer electrically connected to said source-drain region; and
    a gate wiring layer electrically connected to said gate electrode,
    at least one of the component parts being formed from a conductive film or a semiconductor film and being provided with a radiating extension extending outwardly from the at least one component part, said radiating extension extending from both sides of said channel region; and
    said radiating extension extending from both sides of said source-drain region and said source-drain wiring layer is electrically connected to the radiating extension of said source-drain region by a plurality of contact holes.

4. A thin film transistor including a plurality of component parts comprising:
    a channel region;
    a gate electrode opposed to the channel region;
    a gate insulating film provided between the channel region and the gate electrode;
    a source-drain region connected to said channel region;
    a source-drain wiring layer electrically connected to said source-drain region; and
    a gate wiring layer electrically connected to said gate electrode,
    at least one of the component parts being formed from a conductive film or a semiconductor film and being provided with a radiating extension extending outwardly from the at least one component part, said radiating extension extending from both sides of said source-drain region and wherein said source-drain wiring layer electrically connected to the radiating extension of said source-drain region by a plurality of contact holes.

5. A CMOS inverter circuit, comprising:
    two thin film transistors having an inverse conductivity type from each other, each thin film transistor including a plurality of component parts that include:
    a channel region;
    a gate electrode opposed to the channel region;
    a gate insulating film provided between the channel region and the gate electrode;
    a source-drain region connected to said channel region;
    a source-drain wiring layer electrically connected to said source-drain region; and
    a gate wiring layer electrically connected to said gate electrode,
    at least one of the component parts being formed from a conductive film or a semiconductor film and being provided with a radiating extension extending outwardly from the at least one component part, said radiating extension extending from both sides of said source-drain region, adjacent identical-conductive-type source-drain regions of adjacent thin film transistors having the same conductivity type being connected by respective said radiating extension.

6. A CMOS inverter circuit, comprising:
    two thin film transistors having an inverse conductivity type from each other, each thin film transistor including a plurality of component parts that include:
    a channel region;
    a gate electrode opposed to the channel region;
    a gate insulating film provided between the channel region and the gate electrode;
    a source-drain region connected to said channel region;

a source-drain wiring layer electrically connected to said source-drain region; and a gate wiring layer electrically connected to said gate electrode, at least one of the component parts being formed from a conductive film or a semiconductor film and being provided with a radiating extension extending outwardly from the at least one component part, wherein said radiating extension extends from both sides of said source-drain region, adjacent identical-conductive-type source-drain regions of adjacent thin film transistors having the same conductivity type being connected by respective said radiating extension, wherein said radiating extension is provided with a conductivity by using an impurity identical to an impurity of said source-drain region to which said radiating extension is connected.

7. A CMOS inverter circuit, comprising:

two thin film transistors having an inverse conductivity type from each other, each thin film transistor including a plurality of component parts that include:

a channel region;

a gate electrode opposed to the channel region;

a gate insulating film provided between the channel region and the gate electrode;

a source-drain region connected to said channel region;

a source-drain wiring layer electrically connected to said source-drain region; and a gate wiring layer electrically connected to said gate electrode, at least one of the component parts being formed from a conductive film or a semiconductor film and being provided with a radiating extension extending outwardly from the at least one component part, said radiating extension extends from both sides of said source-drain region, adjacent identical-conductive-type source-drain regions of adjacent thin film transistors having the same conductivity type being connected by respective said radiating extension;

wherein said radiating extension is formed in a region opposed to said source-drain wiring layer, said source-drain wiring layer connecting the adjacent source-drain regions of adjacent thin film transistors having the same conductivity type.

8. A liquid crystal display device comprising:

an active matrix substrate;

a driving circuit formed on the active matrix substrate and including a CMOS inverter circuit having two thin film transistors having an inverse conductivity type from each other, each thin film transistor including a plurality of component parts that include:

a channel region;

a gate electrode opposed to the channel region;

a gate insulating film provided between the channel region and the gate electrode;

a source-drain region connected to said channel region;

a source-drain wiring layer electrically connected to said source-drain region; and a gate wiring layer electrically connected to said gate electrode, at least one of the component parts being formed from a conductive film or a semiconductor film and being provided with a radiating extension extending outwardly from the at least one component part, wherein said radiating extension extends from both sides of said source-drain region, adjacent identical-conductive-type source-drain regions of adjacent thin film transistors having the same conductivity type being connected by respective said radiating extension.

9. An electronic apparatus comprising a CMOS inverter circuit, the CMOS inverter circuit having two thin film transistors having an inverse conductivity type from each other, each thin film transistor including a plurality of component parts that include:

a channel region;

a gate electrode opposed to the channel region;

a gate insulating film provided between the channel region and the gate electrode;

a source-drain region connected to said channel region;

a source-drain wiring layer electrically connected to said source-drain region; and a gate wiring layer electrically connected to said gate electrode, at least one of the component parts being formed from a conductive film or a semiconductor film and being provided with a radiating extension extending outwardly from the at least one component part, wherein said radiating extension extends from both sides of said source-drain region, adjacent identical-conductive-type source-drain regions of adjacent thin film transistors having the same conductivity type being connected by respective said radiating extension.

10. A liquid crystal display device comprising:

an active matrix substrate;

a driving circuit formed on the active matrix substrate and including a CMOS inverter circuit having two thin film transistors having an inverse conductivity type from each other, each thin film transistor including a plurality of component parts that include:

a channel region;

a gate electrode opposed to the channel region;

a gate insulating film provided between the channel region and the gate electrode;

a source-drain region connected to said channel region;

a source-drain wiring layer electrically connected to said source-drain region; and a gate wiring layer electrically connected to said gate electrode, at least one of the component parts being formed from a conductive film or a semiconductor film and being provided with a radiating extension extending outwardly from the at least one component part, wherein said radiating extension extends from both sides of said source-drain region, adjacent identical-conductive-type source-drain regions of adjacent thin film transistors having the same conductivity type being connected by respective said radiating extension;

said plurality of component parts each extending in a longitudinal direction, the radiating extension extending in a direction substantially perpendicular to the longitudinal direction.

11. An electronic apparatus comprising a CMOS inverter circuit, the CMOS inverter circuit having two thin film transistors having an inverse conductivity type from each other, each thin film transistor including a plurality of component parts that include:

a channel region;

a gate electrode opposed to the channel region;

a gate insulating film provided between the channel region and the gate electrode;

a source-drain region connected to said channel region;

a source-drain wiring layer electrically connected to said source-drain region; and a gate wiring layer electrically connected to said gate electrode, at least one of the component parts being formed from a conductive film or a semiconductor film and being provided with a radiating extension extending outwardly from the at least one component part, wherein said radiating extension extends from both sides of said source-drain region, adjacent identical-conductive-type source-drain regions of adjacent thin film transistors having the same conductivity type being connected by respective said radiating extension, said plurality of component parts each extending in a longitudinal direction, the radiating extension extending in a direction substantially perpendicular to the longitudinal direction.

12. An active matrix substrate including a driving circuit comprising a thin film transistor according to claim 1.

13. A circuit comprising:

at least two thin film transistors;

a wiring layer connected between a first source or drain region of a first thin film transistor and a second source or drain region of a second thin film transistor;

the wiring layer having an extension extending from both sides of the wiring layer along a substantially perpendicular direction to the direction of a line connected between the first source or drain region and the second source or drain region.

14. A display device comprising a circuit according to claim 13.

15. A liquid crystal display device comprising a circuit according to claim 13.

* * * * *